(12) United States Patent
Kwak et al.

(10) Patent No.: US 9,741,438 B2
(45) Date of Patent: Aug. 22, 2017

(54) NONVOLATILE MEMORY DEVICE AND PROGRAM METHOD THEREOF

(71) Applicants: DongHun Kwak, Hwaseong-si (KR); Kitae Park, Seongnam-si (KR)

(72) Inventors: DongHun Kwak, Hwaseong-si (KR); Kitae Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/965,293

(22) Filed: Dec. 10, 2015

(65) Prior Publication Data

US 2016/0099068 A1  Apr. 7, 2016

Related U.S. Application Data

(63) Continuation of application No. 14/302,087, filed on Jun. 11, 2014, now abandoned.

(30) Foreign Application Priority Data

Sep. 16, 2013 (KR) .......................... 10-2013-0111389

(51) Int. Cl.
*G11C 16/24* (2006.01)
*G11C 16/10* (2006.01)
(Continued)

(52) U.S. Cl.
CPC .......... *G11C 16/24* (2013.01); *G11C 16/0466* (2013.01); *G11C 16/0483* (2013.01);
(Continued)

(58) Field of Classification Search
CPC .. G11C 16/10; G11C 16/3418; G11C 16/3422
See application file for complete search history.

(56) References Cited

U.S. PATENT DOCUMENTS 4,980,861 A  12/1990  Herdt et al.
5,511,022 A   4/1996  Yim et al.
(Continued)

FOREIGN PATENT DOCUMENTS

CN  1694184 A  11/2005
CN  1906700 A   1/2007
(Continued)

OTHER PUBLICATIONS

U.S. Appl. No. 14/546,477, filed Nov. 18, 2015.
(Continued)

*Primary Examiner* — Vanthu Nguyen
(74) *Attorney, Agent, or Firm* — Harness, Dickey & Pierce, P.L.C.

(57) ABSTRACT

A nonvolatile memory device includes at least two strings that are vertically stacked on a substrate and share one bit line. A program method of the nonvolatile memory device includes setting a pre-charge condition on the basis of a disturb environment between the at least two cell strings, pre-charging or not pre-charging an unselected cell string among the at least two cell strings in response to the pre-charge condition and programming memory cells in a selected cell string among the at least two cell strings.

20 Claims, 16 Drawing Sheets

(51) Int. Cl.
  *G11C 16/34*    (2006.01)
  *G11C 16/04*    (2006.01)
  *G11C 16/08*    (2006.01)
  *G11C 16/14*    (2006.01)

(52) U.S. Cl.
  CPC ............. *G11C 16/08* (2013.01); *G11C 16/10* (2013.01); *G11C 16/14* (2013.01); *G11C 16/3418* (2013.01); *G11C 16/3422* (2013.01); *G11C 16/3427* (2013.01); *G11C 16/3431* (2013.01)

(56) References Cited

U.S. PATENT DOCUMENTS

| | | | |
|---|---|---|---|
| 5,673,223 A | 9/1997 | Park | |
| 5,715,193 A | 2/1998 | Norman | |
| 5,740,107 A | 4/1998 | Lee | |
| 5,923,587 A | 7/1999 | Choi | |
| 6,009,014 A | 12/1999 | Hollmer et al. | |
| 6,028,788 A | 2/2000 | Choi et al. | |
| 6,285,587 B1 | 9/2001 | Kwon | |
| 6,288,941 B1 | 9/2001 | Seki et al. | |
| 6,295,227 B1 | 9/2001 | Sakui et al. | |
| 6,650,566 B2 | 11/2003 | Jeong et al. | |
| 6,850,439 B1 | 2/2005 | Tanaka | |
| 6,894,924 B2 | 5/2005 | Choi et al. | |
| 6,975,542 B2 | 12/2005 | Roohparvar | |
| 7,064,981 B2 | 6/2006 | Roohparvar | |
| 7,064,986 B2 | 6/2006 | Lee et al. | |
| 7,079,419 B2 | 7/2006 | Roohparvar | |
| 7,088,617 B2 | 8/2006 | Masuoka et al. | |
| 7,110,301 B2 | 9/2006 | Lee et al. | |
| 7,149,124 B2 | 12/2006 | Nazarian | |
| 7,177,192 B2 | 2/2007 | Yoon et al. | |
| 7,233,522 B2 | 6/2007 | Chen et al. | |
| 7,292,476 B2 | 11/2007 | Goda et al. | |
| 7,397,706 B2 | 7/2008 | Byeon et al. | |
| 7,403,422 B2 | 7/2008 | Kim et al. | |
| 7,403,429 B2 | 7/2008 | Chae et al. | |
| 7,408,806 B2 | 8/2008 | Park et al. | |
| 7,417,904 B2 | 8/2008 | Sivero et al. | |
| 7,433,241 B2 | 10/2008 | Dong et al. | |
| 7,450,430 B2 | 11/2008 | Hemink et al. | |
| 7,450,433 B2 | 11/2008 | Wan et al. | |
| 7,480,178 B2 | 1/2009 | Park et al. | |
| 7,489,556 B2 | 2/2009 | Tanzawa | |
| 7,518,920 B2 | 4/2009 | Kang | |
| 7,529,138 B2 | 5/2009 | Park et al. | |
| 7,532,514 B2 | 5/2009 | Cernea et al. | |
| 7,551,477 B2 | 6/2009 | Mokhlesi et al. | |
| 7,551,487 B2 | 6/2009 | Park et al. | |
| 7,551,492 B2 | 6/2009 | Kim | |
| 7,566,927 B2 | 7/2009 | Kim et al. | |
| 7,606,074 B2 | 10/2009 | Wan et al. | |
| 7,633,803 B2 | 12/2009 | Lee | |
| 7,652,931 B2 | 1/2010 | Park et al. | |
| 7,668,014 B2 | 2/2010 | Hwang | |
| 7,675,783 B2 | 3/2010 | Park et al. | |
| 7,724,577 B2 | 5/2010 | Goda et al. | |
| 7,778,078 B2 | 8/2010 | Nagadomi et al. | |
| 7,778,084 B2 | 8/2010 | Kim et al. | |
| 7,778,086 B2 | 8/2010 | Yu et al. | |
| 7,782,681 B2 | 8/2010 | Kim et al. | |
| 7,800,950 B2 * | 9/2010 | Park | G11C 8/08 365/185.17 |
| 7,813,184 B2 | 10/2010 | Kim et al. | |
| 7,835,193 B2 | 11/2010 | Lee | |
| 7,843,733 B2 | 11/2010 | Kim et al. | |
| 7,848,150 B2 | 12/2010 | Lee et al. | |
| 7,859,902 B2 | 12/2010 | Maejima | |
| 7,884,417 B2 * | 2/2011 | Mizukami | G11C 5/02 257/324 |
| 7,888,731 B2 | 2/2011 | Kim | |
| 7,924,629 B2 | 4/2011 | Park et al. | |
| 7,933,151 B2 | 4/2011 | Maeda et al. | |
| 7,936,004 B2 | 5/2011 | Kito et al. | |
| 7,936,617 B2 | 5/2011 | Sudo | |
| 7,940,572 B2 | 5/2011 | Kim | |
| 7,952,136 B2 | 5/2011 | Kito et al. | |
| 7,983,084 B2 | 7/2011 | Tokiwa et al. | |
| 8,013,389 B2 | 9/2011 | Oh et al. | |
| 8,023,321 B2 | 9/2011 | Kim | |
| 8,054,692 B2 | 11/2011 | Kang et al. | |
| 8,120,959 B2 | 2/2012 | Lee et al. | |
| 8,125,825 B2 | 2/2012 | Seol | |
| 8,149,635 B2 | 4/2012 | Lee | |
| 8,169,822 B2 | 5/2012 | Dutta et al. | |
| 8,169,826 B2 | 5/2012 | Hishida et al. | |
| 8,189,391 B2 | 5/2012 | Itagaki et al. | |
| 8,194,453 B2 | 6/2012 | Maejima | |
| 8,228,733 B2 | 7/2012 | Tokiwa et al. | |
| 8,243,518 B2 | 8/2012 | Oh et al. | |
| 8,274,108 B2 | 9/2012 | Katsumata et al. | |
| 8,318,602 B2 | 11/2012 | Kito et al. | |
| 8,441,855 B2 | 5/2013 | Liu | |
| 8,467,246 B2 | 6/2013 | Kim et al. | |
| 8,472,259 B2 | 6/2013 | Futatsuyama et al. | |
| 8,508,996 B2 | 8/2013 | Kim et al. | |
| 8,559,235 B2 | 10/2013 | Yoon et al. | |
| 8,570,802 B2 | 10/2013 | Shirakawa | |
| 8,570,805 B2 | 10/2013 | Lee et al. | |
| 8,582,372 B2 | 11/2013 | Kim | |
| 8,638,608 B2 | 1/2014 | Lai et al. | |
| 8,837,228 B2 | 9/2014 | Nam et al. | |
| 9,025,383 B2 | 5/2015 | Nam et al. | |
| 9,136,005 B2 | 9/2015 | Choe et al. | |
| 9,257,191 B1 | 2/2016 | Yuan et al. | |
| 9,378,826 B2 * | 6/2016 | Lee | G11C 16/10 |
| 9,390,803 B2 | 7/2016 | Shim et al. | |
| 2002/0071311 A1 | 6/2002 | Jeong et al. | |
| 2005/0006692 A1 | 1/2005 | Kim et al. | |
| 2005/0105333 A1 | 5/2005 | Park et al. | |
| 2005/0128807 A1 | 6/2005 | Chen et al. | |
| 2005/0141283 A1 | 6/2005 | Lee et al. | |
| 2005/0248991 A1 | 11/2005 | Lee et al. | |
| 2006/0050594 A1 | 3/2006 | Park | |
| 2006/0140012 A1 | 6/2006 | Wan et al. | |
| 2007/0018320 A1 | 1/2007 | Tanida et al. | |
| 2007/0025220 A1 | 2/2007 | Yoshikawa et al. | |
| 2007/0070701 A1 | 3/2007 | Kim et al. | |
| 2007/0158736 A1 | 7/2007 | Arai et al. | |
| 2007/0159886 A1 | 7/2007 | Kang | |
| 2007/0183204 A1 | 8/2007 | Kim et al. | |
| 2007/0230253 A1 | 10/2007 | Kim | |
| 2007/0247912 A1 | 10/2007 | Kamigaichi et al. | |
| 2007/0252201 A1 | 11/2007 | Kito et al. | |
| 2007/0297234 A1 | 12/2007 | Cernea et al. | |
| 2008/0007999 A1 | 1/2008 | Park et al. | |
| 2008/0013377 A1 | 1/2008 | Sel et al. | |
| 2008/0089134 A1 | 4/2008 | Ito | |
| 2008/0099819 A1 | 5/2008 | Kito et al. | |
| 2008/0159002 A1 | 7/2008 | Dong et al. | |
| 2008/0159004 A1 | 7/2008 | Hemink et al. | |
| 2008/0173928 A1 | 7/2008 | Arai et al. | |
| 2008/0173933 A1 | 7/2008 | Fukuzumi et al. | |
| 2008/0181020 A1 | 7/2008 | Yu et al. | |
| 2008/0219053 A1 | 9/2008 | Kim | |
| 2008/0253183 A1 | 10/2008 | Mizukami et al. | |
| 2008/0279012 A1 | 11/2008 | Lee | |
| 2008/0285347 A1 | 11/2008 | Byeon | |
| 2008/0310230 A1 | 12/2008 | Kim et al. | |
| 2009/0002182 A1 | 1/2009 | Knox et al. | |
| 2009/0003075 A1 | 1/2009 | Kim et al. | |
| 2009/0003084 A1 | 1/2009 | Kim et al. | |
| 2009/0021983 A1 | 1/2009 | Wan et al. | |
| 2009/0021988 A1 | 1/2009 | Hong et al. | |
| 2009/0027935 A1 | 1/2009 | Nakata et al. | |
| 2009/0097309 A1 | 4/2009 | Mizukami et al. | |
| 2009/0122613 A1 | 5/2009 | Kim et al. | |
| 2009/0168533 A1 | 7/2009 | Park et al. | |
| 2009/0168534 A1 | 7/2009 | Park et al. | |
| 2009/0172267 A1 | 7/2009 | Oribe et al. | |
| 2009/0175081 A1 | 7/2009 | Kim | |

(56) References Cited

U.S. PATENT DOCUMENTS

| | | |
|---|---|---|
| 2009/0180323 A1 | 7/2009 | Park et al. |
| 2009/0268523 A1 | 10/2009 | Maejima |
| 2009/0268524 A1 | 10/2009 | Maejima |
| 2009/0279359 A1 | 11/2009 | Goda et al. |
| 2009/0313419 A1 | 12/2009 | Han |
| 2009/0316491 A1 | 12/2009 | Park et al. |
| 2010/0002507 A1 | 1/2010 | Kang et al. |
| 2010/0020608 A1 | 1/2010 | Kamigaichi et al. |
| 2010/0038703 A1 | 2/2010 | Fukuzumi et al. |
| 2010/0097863 A1 | 4/2010 | Kim et al. |
| 2010/0107021 A1 | 4/2010 | Nagadomi et al. |
| 2010/0110796 A1 | 5/2010 | Park et al. |
| 2010/0124120 A1 | 5/2010 | Park et al. |
| 2010/0159657 A1 | 6/2010 | Arai et al. |
| 2010/0177566 A1 | 7/2010 | Kim et al. |
| 2010/0195383 A1 | 8/2010 | Damle et al. |
| 2010/0195395 A1 | 8/2010 | Jeong et al. |
| 2010/0238732 A1 | 9/2010 | Hishida et al. |
| 2011/0019486 A1 | 1/2011 | Jang et al. |
| 2011/0063913 A1 | 3/2011 | Maejima |
| 2011/0110153 A1 | 5/2011 | Dutta et al. |
| 2011/0149655 A1 | 6/2011 | Tanzawa |
| 2011/0170352 A1 | 7/2011 | Kim |
| 2011/0189853 A1 | 8/2011 | Kito et al. |
| 2011/0199825 A1 | 8/2011 | Han et al. |
| 2011/0199829 A1 | 8/2011 | Lee et al. |
| 2011/0216603 A1 | 9/2011 | Han et al. |
| 2011/0238913 A1 | 9/2011 | Kurashige et al. |
| 2012/0002470 A1 | 1/2012 | Futatsuyama et al. |
| 2012/0039130 A1 | 2/2012 | Yoon et al. |
| 2012/0045890 A1 | 2/2012 | Sel et al. |
| 2012/0060066 A1 | 3/2012 | Nagadomi et al. |
| 2012/0099377 A1 | 4/2012 | Maejima |
| 2012/0275234 A1 | 11/2012 | Lee et al. |
| 2013/0064029 A1 | 3/2013 | Park et al. |
| 2013/0182502 A1 | 7/2013 | Cheo et al. |
| 2013/0208545 A1* | 8/2013 | Lee .................. G11C 16/0483 365/185.23 |
| 2014/0022846 A1 | 1/2014 | Kim |
| 2014/0029344 A1 | 1/2014 | Lee et al. |
| 2014/0056081 A1 | 2/2014 | Yoo et al. |
| 2014/0098606 A1 | 4/2014 | Yip |

FOREIGN PATENT DOCUMENTS

| | | |
|---|---|---|
| CN | 101106140 A | 1/2008 |
| CN | 101165909 A | 4/2008 |
| CN | 101369464 A | 2/2009 |
| CN | 101627444 A | 1/2010 |
| JP | H0293083 | 4/1990 |
| JP | 08-279295 | 10/1996 |
| JP | H08-279295 A | 10/1996 |
| JP | 09-07383 A | 1/1997 |
| JP | 10-032269 A | 2/1998 |
| JP | H10-093083 | 4/1998 |
| JP | 2000048581 A | 2/2000 |
| JP | 2000-222895 A | 8/2000 |
| JP | 2000-269364 A | 9/2000 |
| JP | 2002-203393 A | 7/2002 |
| JP | 2005-032430 A | 2/2005 |
| JP | 2005-116119 A | 4/2005 |
| JP | 2005-196931 A | 7/2005 |
| JP | 2006-073168 A | 3/2006 |
| JP | 2007-087569 A | 4/2007 |
| JP | 2007-180389 A | 7/2007 |
| JP | 2007-184090 A | 7/2007 |
| JP | 2007-200540 A | 8/2007 |
| JP | 2007-266143 A | 10/2007 |
| JP | 2007-272952 A | 10/2007 |
| JP | 2007-293986 A | 11/2007 |
| JP | 2007-323716 A | 12/2007 |
| JP | 2008-103429 A | 5/2008 |
| JP | 2008-172164 A | 7/2008 |
| JP | 2008-310949 A | 12/2008 |
| JP | 2008-311650 A | 12/2008 |
| JP | 2009-026369 A | 2/2009 |
| JP | 2009-088446 A | 4/2009 |
| JP | 2009-124107 A | 6/2009 |
| JP | 2009-266281 A | 11/2009 |
| JP | 2009-266946 A | 11/2009 |
| JP | 2011-508937 A | 3/2011 |
| KR | 10-0157342 B1 | 7/1998 |
| KR | 0172437 | 10/1998 |
| KR | 10-0390145 B1 | 7/2003 |
| KR | 10-0541819 B1 | 1/2006 |
| KR | 2006-0129806 A | 12/2006 |
| KR | 10-0672151 B1 | 1/2007 |
| KR | 10-0688494 B1 | 3/2007 |
| KR | 10-0706797 B1 | 4/2007 |
| KR | 10729359 B1 | 6/2007 |
| KR | 2007-0078355 A | 7/2007 |
| KR | 2007-0096972 A | 10/2007 |
| KR | 10-0784862 B1 | 12/2007 |
| KR | 2008-0005765 A | 1/2008 |
| KR | 2008-0071297 A | 8/2008 |
| KR | 10-0859258 B1 | 9/2008 |
| KR | 2008-0109335 A | 12/2008 |
| KR | 2008-0110168 A | 12/2008 |
| KR | 2009-0002471 A | 1/2009 |
| KR | 10-0884861 A | 2/2009 |
| KR | 10-0890016 B1 | 3/2009 |
| KR | 2009-0034776 A | 4/2009 |
| KR | 10-0897415 B1 | 5/2009 |
| KR | 2009-0048877 A | 5/2009 |
| KR | 2009-0072406 A | 7/2009 |
| KR | 2009-0079037 A | 7/2009 |
| KR | 2011-0032797 A | 3/2011 |
| KR | 20120079737 A | 7/2012 |
| TW | 201003658 A | 1/2010 |
| WO | WO-2009/086618 A1 | 7/2009 |

OTHER PUBLICATIONS

U.S. Appl. No. 14/631,341, filed Feb. 25, 2014.
U.S. Appl. No. 14/579,755, filed Dec. 22, 2014.
U.S. Appl. No. 14/302,087, filed Jun. 11, 2014.
U.S. Appl. No. 14/631,341, filed Feb. 25, 2015.
U.S. Appl. No. 14/590,665, filed Jan. 6, 2015.
U.S. Appl. No. 14/546,477, filed Nov. 18, 2014.
U.S. Appl. No. 14/788,109, filed Jun. 30, 2015.
U.S. Appl. No. 14/820,895, filed Aug. 7, 2015.
U.S. Appl. No. 14/849,029, filed Sep. 9, 2015.
U.S. Notice of Allowance for corresponding U.S. Appl. No. 14/579,755 issued Dec. 23, 2015.
U.S. Notice of Allowance for corresponding U.S. Appl. No. 14/590,665 issued Dec. 24, 2015.
US Office Action dated Jan. 15, 2013 for related U.S. Appl. No. 13/023,934.
US Office Action dated Jan. 15, 2013 for related U.S. Appl. No. 13/028,918.
US Office Action dated Mar. 12, 2013 for related U.S. Appl. No. 12/985,695.
Jaehoon Jang et al. "Vertical Cell Array Using TCAT (Terabit Cell Array Transistor) Technology for Ultra High Density NAND Flash Memory", VLSI Symp. Tech. Dig., pp. 192-193, 2009.
Notice of Allowance dated Oct. 11, 2013 in corresponding U.S. Appl. No. 13/967,455.
Office Action dated Aug. 30, 2013 in corresponding U.S. Appl. No. 12/985,695.
Office Action dated Nov. 1, 2013 in corresponding U.S. Appl. No. 13/545,588.
US Office Action dated Dec. 24, 2013 for related U.S. Appl. No. 13/867,716.
US Office Action dated Jan. 2, 2014 for related U.S. Appl. No. 12/985,695.
Notice of Allowance dated Feb. 7, 2014 for related U.S. Appl. No. 13/967,455.
US Office Action dated Feb. 14, 2014 for related U.S. Appl. No. 14/029,100.

(56) References Cited

OTHER PUBLICATIONS

U.S. Office Action dated Feb. 28, 2014 from related U.S. Appl. No. 13/721,963.
Notice of Allowance dated Mar. 11, 2014 from related U.S. Appl. No. 13/545,588.
Office Action dated Mar. 21, 2014 in co-pending U.S. Appl. No. 13/607,038.
Japanese Office Action for corresponding Japanese application No. 2011-012074 received Apr. 1, 2014.
Japanese Examination report for corresponding Japanese application No. 2011-012072 dated Apr. 8, 2014.
Office Action dated Jun. 12, 2014 for corresponding U.S. Appl. No. 14/043,256.
Notice of Allowance for corresponding U.S. Appl. No. 13/607,038 dated Aug. 1, 2014.
Notice of Allowance for corresponding U.S. Appl. No. 14/029,100 dated Aug. 6, 2014.
T. Maeda et al. "Multi-stacked 1G cell/layer Pipe-shaped BiCS Flash Memory"; 2009 Symposium on VLSI Circuits, p. 22-23; Jun. 2009.
Notice of Allowance for corresponding U.S. Appl. No. 13/721,963 dated Aug. 15, 2014.
Notice of Allowance for corresponding U.S. Appl. No. 14/043,256 dated Aug. 21, 2014.
Notice of Allowance for corresponding U.S. Appl. No. 12/985,695 dated Aug. 18, 2014.
Office Action dated Apr. 5, 2013 for corresponding U.S. Appl. No. 13/029,518.
Office Action dated Jul. 23, 2013 for corresponding U.S. Appl. No. 13/211,743.
Office Action dated Nov. 5, 2013 for corresponding U.S. Appl. No. 14/043,256.
Notice of Allowance dated Apr. 29, 2014 for corresponding U.S. Appl. No. 12/985,695.
U.S. Office Action for corresponding U.S. Appl. No. 14/631,341 issued Jun. 29, 2015.
U.S. Notice of Allowance for corresponding U.S. Appl. No. 14/820,895 issued Oct. 15, 2015.
U.S. Office Action for corresponding U.S. Appl. No. 14/788,109 issued Oct. 22, 2015.
Notice of Allowance issued in corresponding U.S. Appl. No. 13/867,716 dated Sep. 22, 2014.
U.S. Office Action issued in corresponding U.S. Appl. No. 14/579,755 dated Mar. 25, 2015.
U.S. Office Action issued in corresponding U.S. Appl. No. 14/546,477 dated Jan. 28, 2015.
U.S. Notice of Allowance for corresponding U.S. Appl. No. 14/546,477 mailed May 18, 2015.
U.S. Office Action for corresponding U.S. Appl. No. 14/302,087 mailed Dec. 4, 2015.
First Action Interview Pilot Program Pre-Interview Communication for U.S. Appl. No. 14/811,380 dated Mar. 4, 2016.
Notice of Allowance issued in corresponding U.S. Appl. No. 14/849,029 dated Feb. 17, 2016.
U.S. Office Action for corresponding U.S. Appl. No. 15/176,269 dated Aug. 11, 2016.
U.S. Office Action dated Jan. 31, 2017 issued in co-pending U.S. Appl. No. 15/176,269.
U.S. Notice of Allowance dated Apr. 17, 2017 issued in co-pending U.S. Appl. No. 15/176,269.

\* cited by examiner

NONVOLATILE MEMORY DEVICE AND PROGRAM METHOD THEREOF

CROSS-REFERENCE TO RELATED APPLICATIONS

This U.S. non-provisional patent application is a continuation of U.S. patent application Ser. No. 14/302,087, filed on Jun. 11, 2014, which claims priority under 35 U.S.C. §119 to Korean Patent Application No. 10-2013-0111389, filed on Sep. 16, 2013, the entire contents of each of the above-referenced applications are hereby incorporated by reference.

BACKGROUND

The present disclose relates to nonvolatile memory devices and/or program methods thereof, and more particularly, to a three-dimensional nonvolatile memory device and/or a program method thereof.

A semiconductor memory device may be a memory device that is embodied using semiconductors such as silicon Si, germanium Ge, gallium arsenide GaAs, indium phospide InP, etc. A semiconductor memory device may be classified as a volatile memory device or a nonvolatile memory device.

A volatile memory device loses its stored data when its power supply is interrupted. Examples of volatile memory devices include static RAM (SRAM), dynamic RAM (DRAM), synchronous DRAM (SDRAM), etc. A nonvolatile memory device retains its stored data even when its power supply is interrupted. Examples of nonvolatile memory devices include read only memory (ROM), programmable ROM (PROM), electrically programmable ROM (EPROM), electrically erasable and programmable ROM (EEPROM), flash memory, phase change RAM (PRAM), magnetic RAM (MRAM), a resistive RAM (RRAM), ferroelectric RAM (FRAM), etc. Flash memory may classified into a NOR type flash memory and a NAND type flash memory.

To increase the integration, a three-dimensional memory having a structure that memory cells are stacked on a substrate is being studied. The three-dimensional memory may have higher integration and lower unit cost aspects compared to a conventional flat-surface type memory. Improving the reliability of three-dimensional memory may be desired.

SUMMARY

Example embodiments of inventive concepts relate to a program method of a nonvolatile memory device.

Example embodiments of inventive concepts also relate to a nonvolatile memory device.

According to example embodiments of inventive concepts, a program method of nonvolatile memory device including at least two cell strings that are vertically stacked on a substrate and share one bit line is disclosed. The program method may include setting a pre-charge condition on the basis of a disturb environment between the at least two cell strings; one of pre-charging an unselected cell string among the at least two cell strings in response to the pre-charge condition, and not pre-charging the unselected cell string among the at least two cell strings in response to the pre-charge condition; and programming memory cells of a selected cell string among the at least two cell strings.

In example embodiments, the one of pre-charging the unselected cell string and not pre-charging the unselected cell string may include the pre-charging the unselected cell string. The pre-charging the unselected cell string may include of adjusting a level of a pre-charge voltage applied to the unselected cell string in response to the pre-charge condition, and adjusting a time of applying the pre-charge voltage to the unselected cell string in response to the pre-charge condition.

In example embodiments, the setting the pre-charge condition may include setting the pre-charge condition in response to a level of a program voltage applied during the programming memory cells of the selected cell string.

In example embodiments, the one of pre-charging the unselected cell string and not pre-charging the unselected cell string may include the pre-charging the unselected cell string if the level of the program voltage is greater than a reference value.

In example embodiments, the pre-charging the unselected cell string may include increasing a level of a pre-charge voltage applied to the unselected cell string as the level of the program voltage becomes greater.

In example embodiments, the setting the pre-charge condition may include setting the pre-charge condition in response to a number of program loops during the programming memory cells of the selected cell string.

In example embodiments, the one of pre-charging the unselected cell string and not pre-charging the unselected cell string may include the pre-charging the unselected cell string if the number of the program loops is greater than a reference value.

In example embodiments, the pre-charging the unselected cell string may include increasing a level of a pre-charge voltage applied to the unselected cell string as the number of the program loops becomes larger.

In example embodiments, the setting the pre-charge condition may include setting the pre-charge condition in response to a program state of data programmed in at least one memory cell of the non-volatile memory device.

In example embodiments, the one of pre-charging the unselected cell string and not pre-charging the unselected cell string may include the pre-charging the unselected cell string if the program state indicates the data has been programmed in at least one memory cell.

In example embodiments, the program method may further include adjusting the pre-charge condition based on a wear environment of the nonvolatile memory.

In example embodiments, the wear environment may include one of a wear level index, a number of memory cells in the at least two string having a threshold voltage higher than a reference threshold voltage, and a number of program/erase cycles.

In example embodiments, the method may further include adjusting the pre-charge condition based on a program mode of the nonvolatile memory.

According to example embodiments of inventive concepts, a nonvolatile memory device may include a memory cell array including at least two cell strings that are vertically stacked on a substrate and share one bit line, wherein each of the cell strings includes a string select transistor, a ground select transistor and a plurality of memory cells serially connected between the string select transistor and the ground select transistor. The nonvolatile memory device may include a control logic configured to control the memory cell array so that a pre-charge condition is set based on a disturb environment between the at least two cell strings. The control logic may be configured to cause an unselected cell string among the at least two cell strings to be pre-charged or not pre-charged in response to the pre-charge condition before programming memory cells included in a selected cell string among the at least two cell strings.

In example embodiments, the controller may be configured to set the pre-charge condition in response to a level of a pre-charge voltage being applied to the unselected cell string or an applying time of the pre-charge voltage to the unselected cell string is adjusted in response to the pre-charge condition.

According to example embodiments, a program method of a nonvolatile memory device including a plurality of cell strings on a substrate, the plurality of cell strings including at least two cell strings connected to a bit line in common, may include: determining a parameter corresponding to a program disturb environment between the at least two cell strings connected to the bit line in common; controlling a pre-charge operation based on whether the parameter is greater than or equal to a threshold value, the controlling the pre-charge operation including one of pre-charging an unselected cell string among the at least two cell strings if the parameter is greater than or equal to the threshold value, and not pre-charging the unselected the unselected cell string among the at least two cell strings if the parameter is less than the threshold value; and programming a selected cell string among the at least two cell strings.

In example embodiments, the plurality of cell strings may be connected to different string select lines respectively, each one of the plurality of cell strings may include a plurality of memory cells vertically stacked on each other between at least one ground select transistor and at least one string select transistor on the substrate, and the pre-charging the selected string among the at least one two cell strings may include providing a supplying voltage to one of the string select lines that is connected to the selected cell string, and providing a pre-charge voltage to the bit line connected in common to the at least two cell strings during the providing the supply voltage to the one of the string select lines connected to the selected cell string.

In example embodiments, the determining the parameter may include determining whether a level of a program voltage to be applied during the programming the selected cell string is greater than or equal to the threshold value.

In example embodiments, the determining the parameter may include determining whether a loop number of the programming the selected cell string is greater than or equal to the threshold value.

In example embodiments, the determining the parameter may include determining whether a number of erase upper cells in the nonvolatile memory device is greater than or equal to the threshold value.

BRIEF DESCRIPTION OF THE FIGURES

The foregoing and other features and advantages of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION OF EXAMPLE EMBODIMENTS

Figure 1:
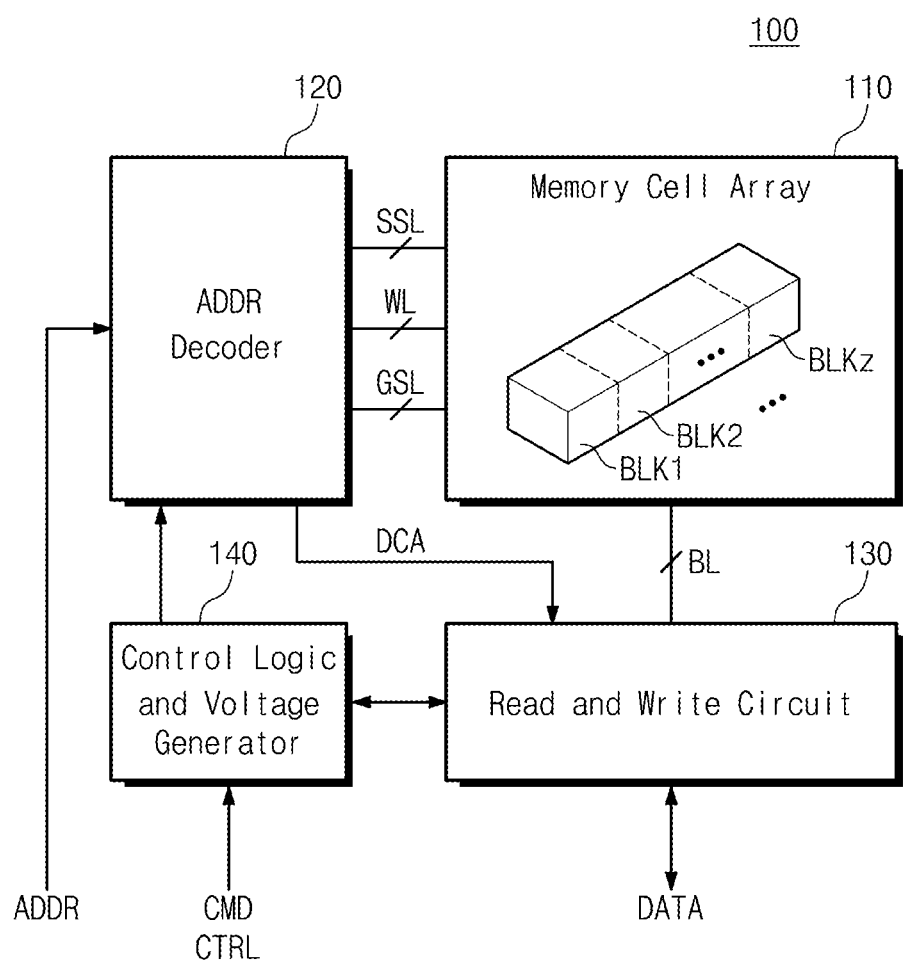
FIG. 1 is a block diagram illustrating a nonvolatile memory device in accordance with example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Example embodiments of inventive concepts may be described with reference to a NAND flash memory. However, inventive concepts may be applied to various nonvolatile memory devices such as an electrically erasable and programmable ROM (EEPROM), a NOR flash memory device, a phase change RAM (PRAM), a magnetic RAM (MRAM), a resistive RAM (RRAM), a ferroelectric RAM (FRAM), etc.

In addition, a nonvolatile memory device according to example embodiments of inventive concepts may be a charge trap flash (CTF) memory device using an insulating layer such as $Si_3N_4$, $Al_2O_3$, HfAlO, HfSiO, etc. as a charge storage layer. A charge trap flash memory device, after a program or erase voltage is applied to perform a program or erase operation, has a transient characteristic that an electron/hole in a charge storage layer is energetically stabilized without an injection/emission of an electron or hole into/from the charge storage layer. However, this is only an illustration and example embodiments of inventive concepts are not limited to a charge trap flash (CTF) memory device.

FIG. 1 is a block diagram illustrating a nonvolatile memory device 100 in accordance with example embodiments of inventive concepts. Referring to FIG. 1, the nonvolatile memory device 100 includes a memory cell array 110, an address decoder 120, a read & write circuit 130 and a control logic & voltage generator 140.

The memory cell array 110 is connected to the address decoder 120 through string select lines SSL, word lines WL and ground select lines GSL. The memory cell array 110 is connected to the read & write circuit 130 through bit lines BL. The memory cell array 110 includes a plurality of memory blocks BLK1~BLKz. Each memory block may include a plurality of memory cells and a plurality of select transistors. The memory cells may be connected to word lines WL and the select transistors may be connected to string select lines SSL or ground select lines GSL. Memory cells of each memory block can be stacked in a direction perpendicular to a substrate to form a three-dimensional structure. Memory cells of each memory block can store one or more bits.

The address decoder 120 is configured to decode a row address among received addresses. Using the decoded row address, the address decoder 120 selects string select lines SSL, word lines WL and ground select lines GSL. The address decoder 120 receives various voltages from the control logic & voltage generator 140 to transmit the received voltages to selected and unselected string select lines SSL, word lines WL and ground select lines GSL respectively.

The address decoder 120 is configured to decode a column address among received addresses. A decoded column address is transmitted to the read & write circuit 130. The address decoder 120 includes a row decoder, a column decoder, and an address buffer.

The read & write circuit 130 is connected to the memory cell array 110 through bit lines BL and exchanges data with the outside. The read & write circuit 130 operates under the control of the control logic & voltage generator 140. The read & write circuit 130 is configured to receive a decoded column address DCA from the address decoder 120. Using the decoded column address DCA, the read & write circuit 130 selects bit lines BL.

The read & write circuit 130 receives data from the outside to write the received data in the memory cell array 110. The read & write circuit 130 reads data from the memory cell array 110 to transmit the read data to the outside. The read & write circuit 130 can read data from a first storage area of the memory cell array 110 to store the read data in a second storage area of the memory cell array 110. The read & write circuit 130 is configured to perform a copy-back operation.

The read & write circuit 130 includes constituent elements such as a page buffer (or page register), a column select circuit, a data buffer, etc. The read & write circuit 130 may include constituent elements such as sense amplifier, a column select circuit, a data buffer, etc.

The control logic & voltage generator 140 is connected to the address decoder 120 and the read & write circuit 130. The control logic & voltage generator 140 is configured to control the whole operation of the nonvolatile memory device 100. The control logic & voltage generator 140 is configured to generate various voltages that are used in the operation of the nonvolatile memory device 100. The control logic & voltage generator 140 operates in response to a control signal CTRL and a command CMD being transmitted from the outside.

The control logic & voltage generator 140 can pre-charge a program-inhibited unselected cell string to compensate program disturb with respect to program inhibited memory cells.

The control logic & voltage generator 140 can differently set a pre-charge condition (for example, whether it is pre-charged or not, or a level of a pre-charge voltage) depending on a disturb condition. A pre-charge operation of an unselected cell string will be described in further detail with reference to FIGS. 5 through 10.

The nonvolatile memory device 100 can perform a pre-charge operation with respect to an unselected cell string adaptively to a disturb environment using the unselected cell string pre-charge operation described above. The nonvolatile memory device 100 can perform a program operation at an improved speed while limiting (and/or preventing) program disturb using the unselected cell string pre-charge operation.

Figure 2:
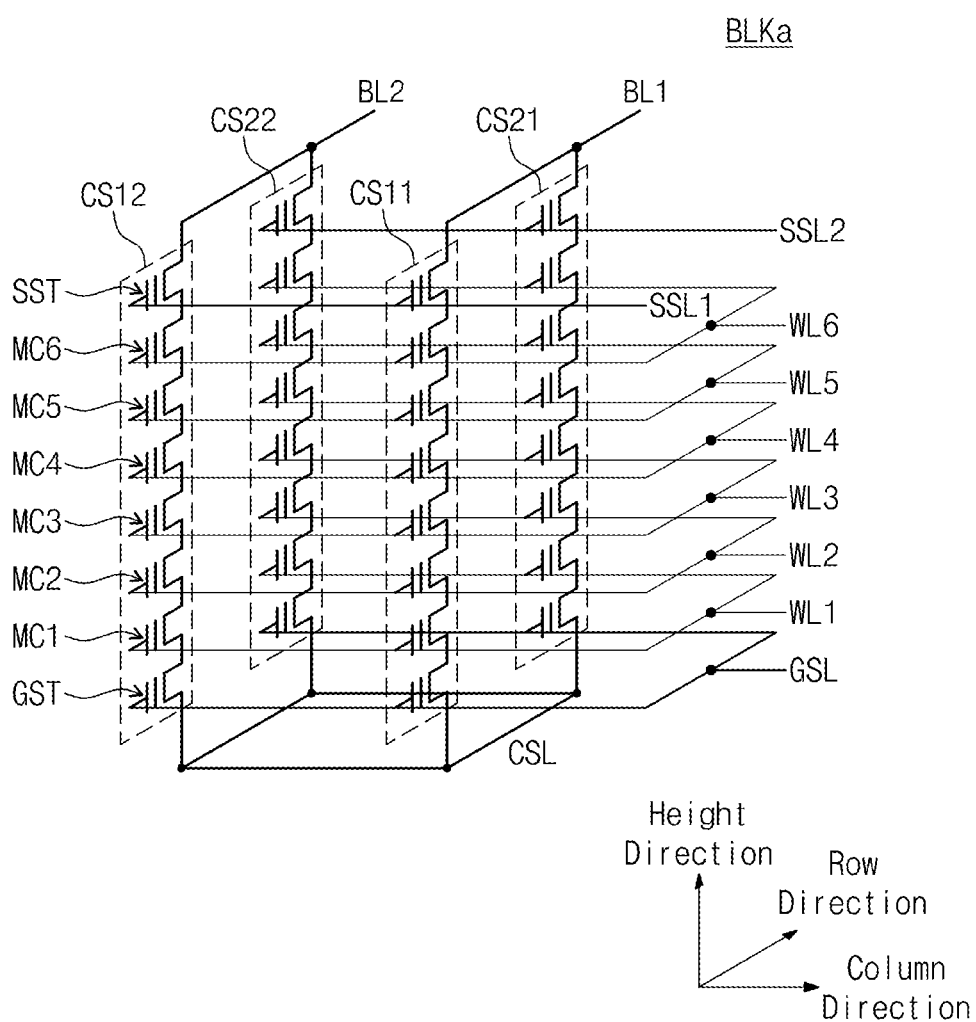
FIG. 2 is a circuit diagram of one memory block among the memory blocks of the memory cell array of FIG. 1.

FIG. 2 is a circuit diagram of one memory block BLKa among the memory blocks BLK1~BLKz of the memory cell array of FIG. 1.

Referring to FIG. 2, the memory block BLKa includes a plurality of cell strings CS11, CS12, CS21, and CS22. Each cell string includes a string select transistor SST, a ground select transistor GST and memory cells MC1~MC6. In each cell string, memory cells MC1~MC6 are serially connected between the string select transistor SST and the ground select transistor GST.

Control gates of ground select transistors GST of the cell strings CS11, CS12, CS21, and CS22 can be connected to a ground select line GSL in common. One ends of the ground select transistors GST may be connected to memory cells MC1 and the other ends may be connected to a common source line CSL in common.

Control gates of memory cells MC1 of the cell strings CS11, CS12, CS21, and CS22 can be connected to a word line WL1 in common. Similarly, control gates of memory cells MC2 can be connected to a word line WL2 in common, control gates of memory cells MC3 can be connected to a word line WL3 in common, control gates of memory cells MC4 can be connected to a word line WL4 in common, control gates of memory cells MC5 can be connected to a word line WL5 in common, and control gates of memory cells MC6 can be connected to a word line WL6 in common.

Control gates of cell strings CS11 and CS12 may be connected to a string select line SSL1. Similarly, control gates of cell strings CS21 and CS22 may be connected to a string select line SSL2.

One ends of string select transistors SST of the cell strings CS11 and CS21 are connected to a bit line BL1 and the other ends are connected to memory cells MC6. One ends of string select transistors SST of the cell strings CS12 and CS22 are connected to a bit line BL2 and the other ends are connected to memory cells MC6.

For explanation purposes, a row, a column and a height may be defined. An extension direction of the string select lines SSL1 and SSL2 may be a row direction. Cell strings CS11 and CS12 are arranged along the row direction to form a first row. Cell strings CS21 and CS22 are arranged along the row direction to form a second row.

An extension direction of the bit lines BL1 and BL2 may be a column direction. Cell strings CS11 and CS21 are arranged along the column direction to form a first column. Cell strings CS12 and CS22 are arranged along the column direction to form a second column.

A direction from the ground select transistors GST toward the string select transistors SST may be a height direction.

The memory cells MC1~MC6 are arranged along the row and column directions and form a three-dimensional structure stacked along the height direction. Memory cells MC having a same height are connected to one word line WL in common. Memory cells MC having different heights from one another are connected to different word lines WL respectively. String select transistors SST of a same row may be connected to one string select line (SSL1 or SSL2) in common. String select transistors SST of different rows may be connected to different string select lines SSL1 and SSL2 respectively. String select transistors SST of a same column may be connected to a same bit line (BL1 or BL2). String select transistors SST of different columns may be connected to different bit lines BL1 and BL2 respectively.

Each of the memory cells MC1~MC6 can store at least two bits. That is, the memory cells MC1~MC6 may be multi-level cells (MCL).

In FIG. 2, the memory block BLKa includes four cell strings CS11, CS12, CS21, and CS22. However, the number of cell strings of the memory block BLKa is not limited. More than two cell strings can be provided along a row direction or a column direction. In FIG. 2, each cell string includes six memory cells MC1~MC6. However, the number of memory cells of each string is not limited. More than six memory cells can be provided along a height direction in each string. In other words, each string (e.g., CS11) may include more than six memory cells (e.g., MC1) sequentially stacked on each other between at least one ground select transistor and at least one string select transistor. Similarly, each string may include fewer than six memory cells sequentially stacked on each other between at least one ground select transistor and at least one string select transistor.

In FIG. 2, ground select transistors GST are connected to one ground select line GSL in common. However, like the string select transistors SST, a structure of the memory block BLKa may be changed so that ground select transistors GST of a same row are connected to one ground select line in common and ground select transistors GST of different rows are connected to different ground select lines respectively.

In FIG. 2, one string select transistor SST and one ground select transistor GST are provided to each cell string. However, two or more string select transistors SST and/or two or more ground select transistors GST can be provided to each cell string.

At least one of the memory cells MC1~MC6 of each cell string may be used as a dummy memory cell.

Figure 3:
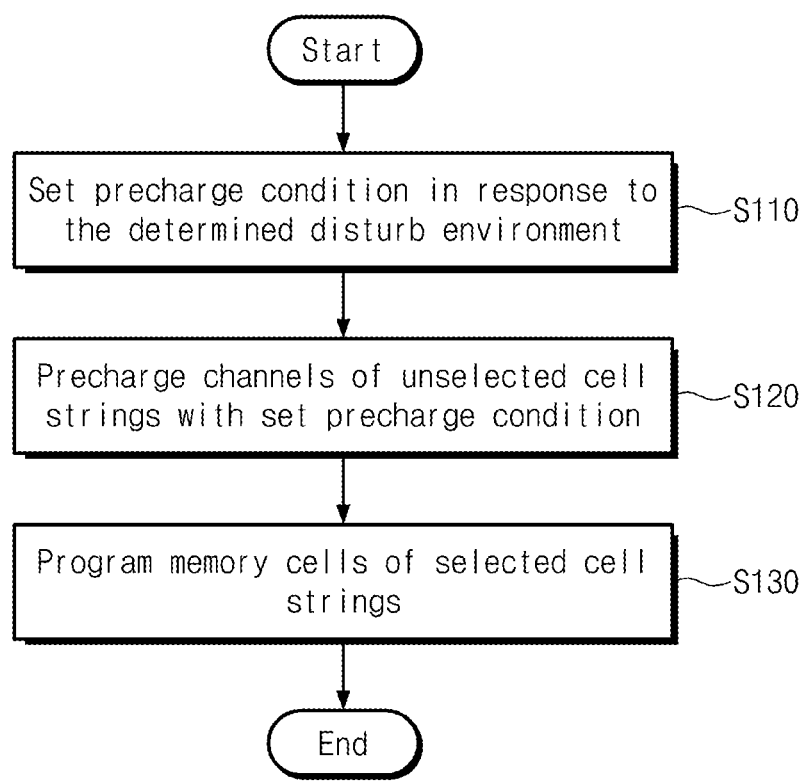
FIG. 3 is a flow chart illustrating a program method according to example embodiments of inventive concepts with respect to the nonvolatile memory device of FIG. 1.

FIG. 3 is a flow chart illustrating a program method according to example embodiments of inventive concepts with respect to the nonvolatile memory device of FIG. 1.

Referring to FIG. 3, in a program method of a nonvolatile memory device according to example embodiments of inventive concepts, since a pre-charge operation with respect to an unselected cell string can be performed adaptively to a disturb environment, a program operation can be performed at an improved speed while program disturb is limited (and/or prevented).

In a operation S110, a disturb environment is determined. In a current program operation, the disturb environment indicates the degree that memory cells of a cell string unselected by a program operation with respect to memory cells of the selected cell string are disturbed.

In example embodiments of inventive concepts, a disturb environment can be determined in various ways. For example, a disturb environment may be determined in response to a level of a program voltage to be provided to memory cells to be programmed. A disturb environment may also be determined in response to the number of current program loops, the degree of a program pass, a wear level index and/or an erase cell threshold voltage.

A pre-charge condition may be set in response to the determined disturb environment. The pre-charge condition indicates a pre-charge condition with respect to channels of unselected cell strings. The pre-charge condition may include, for example, whether a pre-charge operation is performed or not, and/or a level of a pre-charge voltage being applied, etc.

In a operation S120, channels of unselected cell strings are pre-charged by set pre-charge condition.

In example embodiments of inventive concepts, an unselected cell string to be pre-charged with the pre-charge condition may be a cell string that shares a bit line with a selected cell string and is connected a different string select line than the string select line connected to the selected cell string. For example, in the case that a cell string CS22 (refer to FIG. 2) is selected, an unselected cell string to be pre-charged by the pre-charge condition may be a cell string CS12 (refer to FIG. 2). However, this is only an illustration and example embodiments are not limited by the foregoing example.

In example embodiments, a nonvolatile memory device, in response to the set pre-charge condition, can control a pre-charge with respect to channels of unselected cell strings by controlling a level and an applying time of a pre-charge voltage being applied to an unselect bit line connected to an unselected cell string, or omitting a pre-charge operation.

A pre-charge operation with respect to an unselected cell string can be selectively performed depending on a pre-charge condition.

In the operation S110, the nonvolatile memory device determines a disturb environment to set a pre-charge condition so that a pre-charge operation of an unselected cell string is not performed in an environment in which an effect of a program disturb is not great. The nonvolatile memory device can set a pre-charge condition of the operation S110 so that a pre-charge operation is not performed in an environment in which a low program voltage is applied or wear volume of memory cells is low. The nonvolatile memory device can reduce time and resources utilized for a pre-charge operation using a pre-charge operation of a selective unselected cell string bit line.

A level or applying time of a pre-charge voltage being applied to unselect bit lines may be changed depending on a pre-charge condition. The nonvolatile memory device can set a pre-charge condition of the operation S110 so that a high pre-charge voltage is provided in an environment in which a program voltage having a great program disturb effect is applied. The nonvolatile memory device can set a pre-charge condition of the operation S110 so that a pre-charge voltage having more than a desired (and/or alternatively predetermined) value is provided in a loop having more than the desired (and/or alternatively predetermined) number of times.

The nonvolatile memory device can reduce time and resources utilized for a pre-charge operation by controlling a pre-charge voltage being provided to a pre-charge operation of an unselected cell string.

In a operation S130, a program operation is performed on selected memory cells included in a selected cell string.

According to the program operation described above, since a pre-charge operation with respect to an unselected cell string can be performed adaptively to a disturb environment, a program operation can be performed at an improved speed while limiting (and/or preventing) a program disturb.

Figure 4:
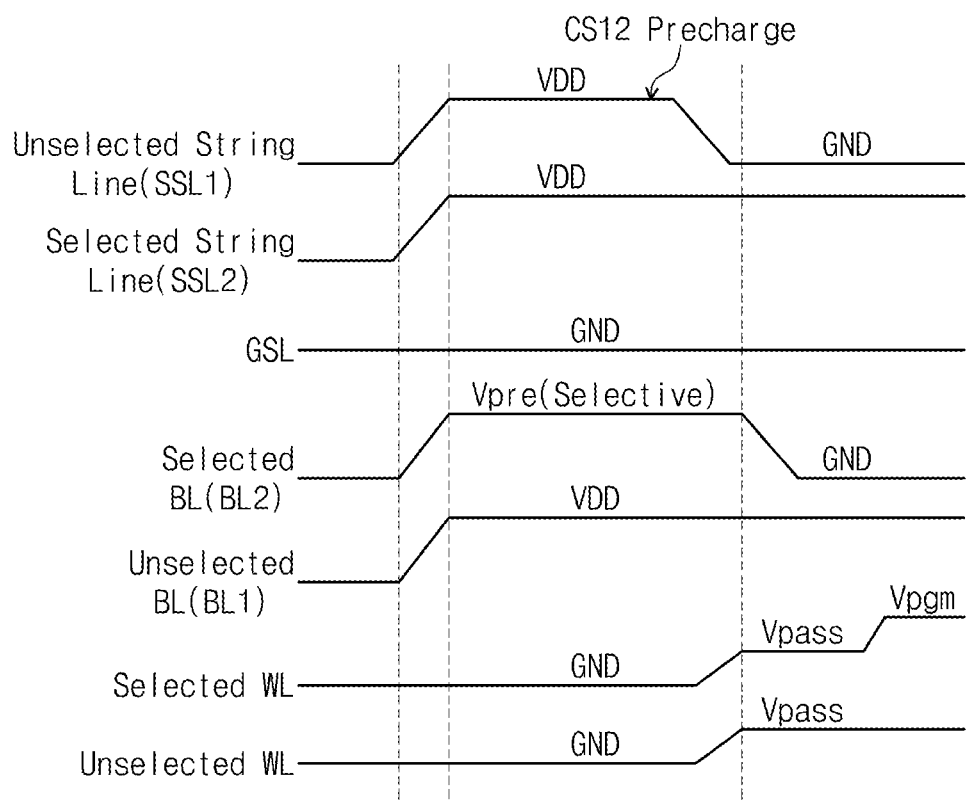
FIG. 4 is a timing diagram illustrating a voltage applied to the memory block of FIG. 2 according to a program operation of FIG. 3 according to example embodiments of inventive concepts.

FIG. 4 is a timing diagram illustrating a voltage applied to the memory block of FIG. 2 according to a program operation of FIG. 3 according to example embodiments of inventive concepts. It is assumed that a cell string CS22 is selected to be programmed. It is assumed that a cell string CS12 that shares a select bit line BL2 with the cell string CS22 but is connected to other string line is pre-charged while a program operation with respect to the cell string CS22 is performed.

A supply voltage VDD is provided to string select lines SSL1 and SSL2. The supply voltage VDD may be a voltage that is greater than or equal to a threshold voltage of one or more string select transistors connected to string lines SSL1 and SSL2, but example embodiments are not limited thereto. A ground voltage GND is applied to a ground select line GSL.

A pre-charge voltage Vpre is provided to a bit line BL2 to perform a pre-charge operation with respect to the unselected cell string CS12. The pre-charge voltage Vpre is provided in response to a pre-charge condition previously determined based on a disturb environment.

For example, as described in FIG. 3, a level or time of the pre-charge voltage Vpre may vary in response to the pre-charge condition. The pre-charge voltage Vpre may be provided in response to the pre-charge condition. In an environment in which the degree of disturb with respect to the unselected cell string CS12 is not high, a pre-charge voltage Vpre applying operation may be omitted.

In response to the provided pre-charge voltage, a channel of the unselected cell string CS12 is pre-charged. After the unselected cell string CS12 is pre-charged, a ground voltage GND is provided to a string select line SSL1 to perform a boosting operation.

After the ground voltage GND is provided to the string select line SSL1, the ground voltage GND is provided to the selected bit line BL2 to program the selected cell string CS22. A program voltage Vpgm is provided to a selected word line and a pass voltage Vpass is provided to unselected word lines.

In a program operation according to example embodiments of inventive concepts, since the unselected cell string is pre-charged, program disturb with respect to memory cells of the unselected cell string can be limited (and/or prevented). Since an unselect cell string pre-charge operation can be performed adaptively to a disturb environment, a program operation can be performed at an improved speed while limiting (and/or preventing) program disturb.

Figure 5:
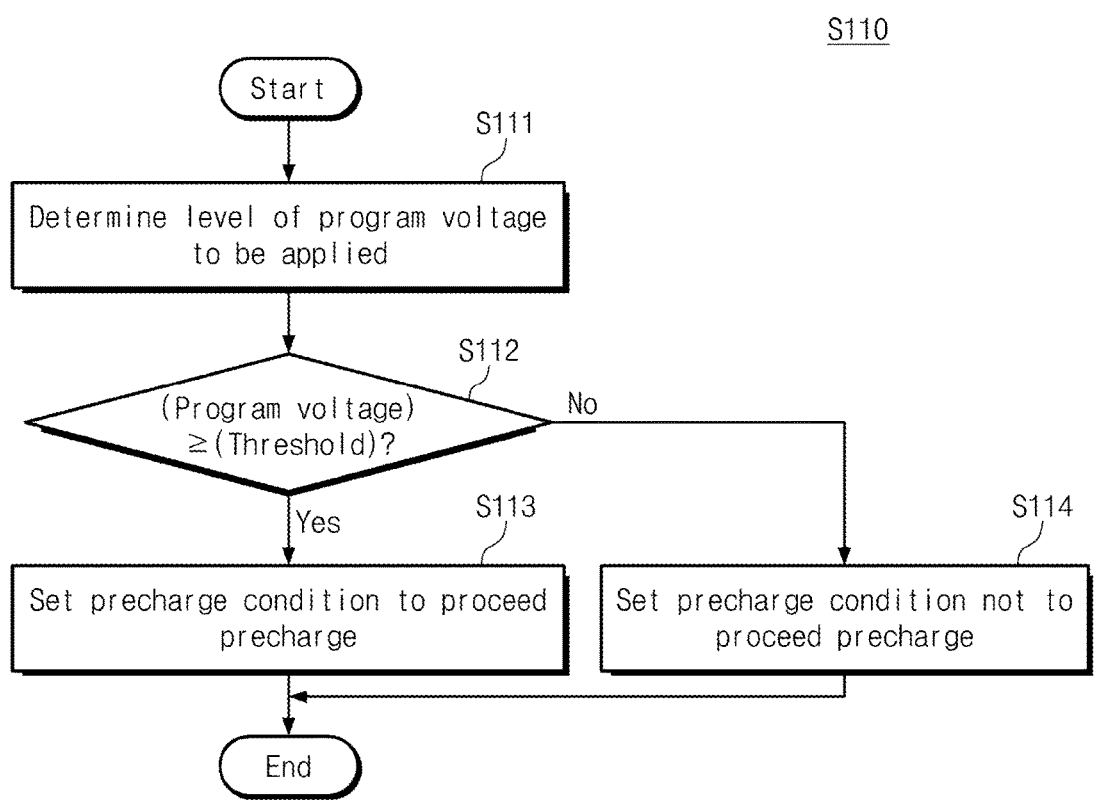
FIG. 5 is a flow chart illustrating a pre-charge condition setting operation of FIG. 3 in a program operation according to example embodiments of inventive concepts.

FIG. 5 is a flow chart illustrating a pre-charge condition setting operation of FIG. 3 in a program operation according to example embodiments of inventive concepts. According to the pre-charge condition set operation S110, a pre-charge condition can be set so that a pre-charge operation is selectively performed according to a level of a program voltage to be applied in a program operation.

In a operation S111, a level of a program voltage to be applied in a program operation is determined. A level of a program voltage may be variously determined according to the number of program loops, data to be programmed, etc. As a greater program voltage is applied to a selected cell string, the degree of program disturb with respect to an unselected cell string becomes high.

In a operation S112, the program voltage determined in the operation S111 is compared with a desired (and/or alternatively predetermined) reference value (e.g., threshold value). The reference value may be a value previously designated in a register. The reference value may be set by a user.

If a level of the program voltage is greater than the reference value, in a operation S113, a pre-charge condition is set so that a pre-charge operation with respect to an unselected cell string is performed. If a level of the program voltage is smaller than the reference value, in a operation S114, a pre-charge condition is set so that a pre-charge operation with respect to an unselected cell string is omitted.

According to the pre-charge condition set operation S110 described above, since the pre-charge condition is set so that a pre-charge operation is selectively performed according to a level of a program voltage to be applied in a program operation, the program operation can be performed at an improved speed while limiting (and/or preventing) program disturb.

Figure 6:
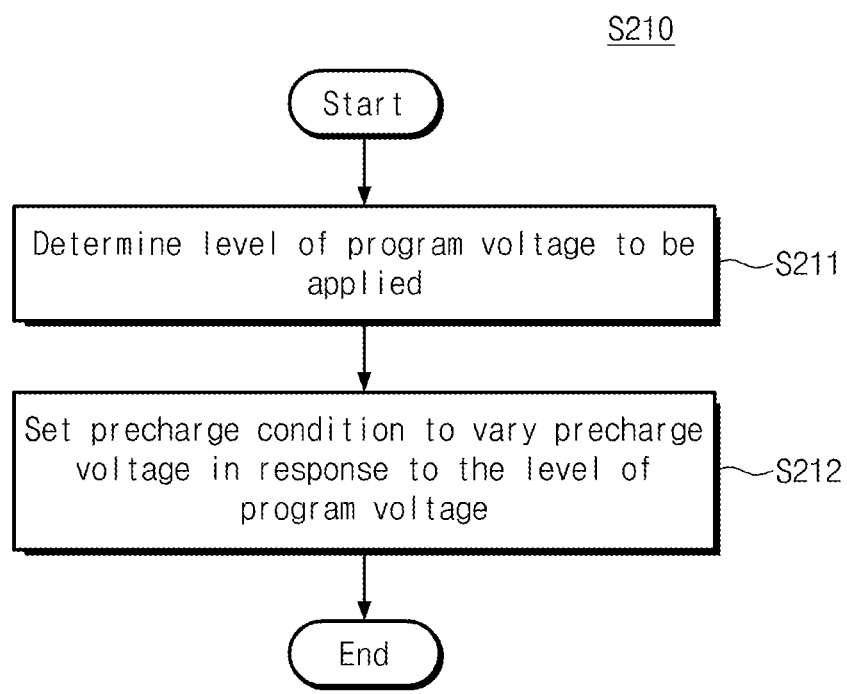
FIG. 6 is a flow chart illustrating a pre-charge condition setting operation of FIG. 3 in a program operation according to example embodiments of inventive concepts.

FIG. 6 is a flow chart illustrating a pre-charge condition setting operation of FIG. 3 in a program operation according to example embodiments of inventive concepts. According to a pre-charge condition set operation S210 of FIG. 6, a pre-charge condition may be set so that a level of a pre-charge level varies according to a level of a program voltage to be applied in a program operation.

In a operation S211, a level of a program voltage to be applied in a program operation is determined. The level of the program voltage may be variously determined according to the number of program loops, data to be programmed, etc. As a greater program voltage is applied to a selected cell string, the degree of program disturb with respect to an unselected cell string becomes high.

In a operation S212, a pre-charge condition is set so that a level of a pre-charge voltage is determined in response to the level of the program voltage determined in the operation S211.

For example, the program voltage can be classified into desired (and/or alternatively predetermined) sections according to the level of the program voltage. The pre-charge voltage can be discretely provided in response to a section to which the program voltage belongs.

According to the pre-charge condition set operation S210 described above, a pre-charge condition is set so that the pre-charge voltage varies according to a level of the pre-charge voltage to be applied in the program operation. According to the pre-charge condition set operation S210, the program operation can be performed at an improved speed while limiting (and/or preventing) program disturb.

Figure 7:
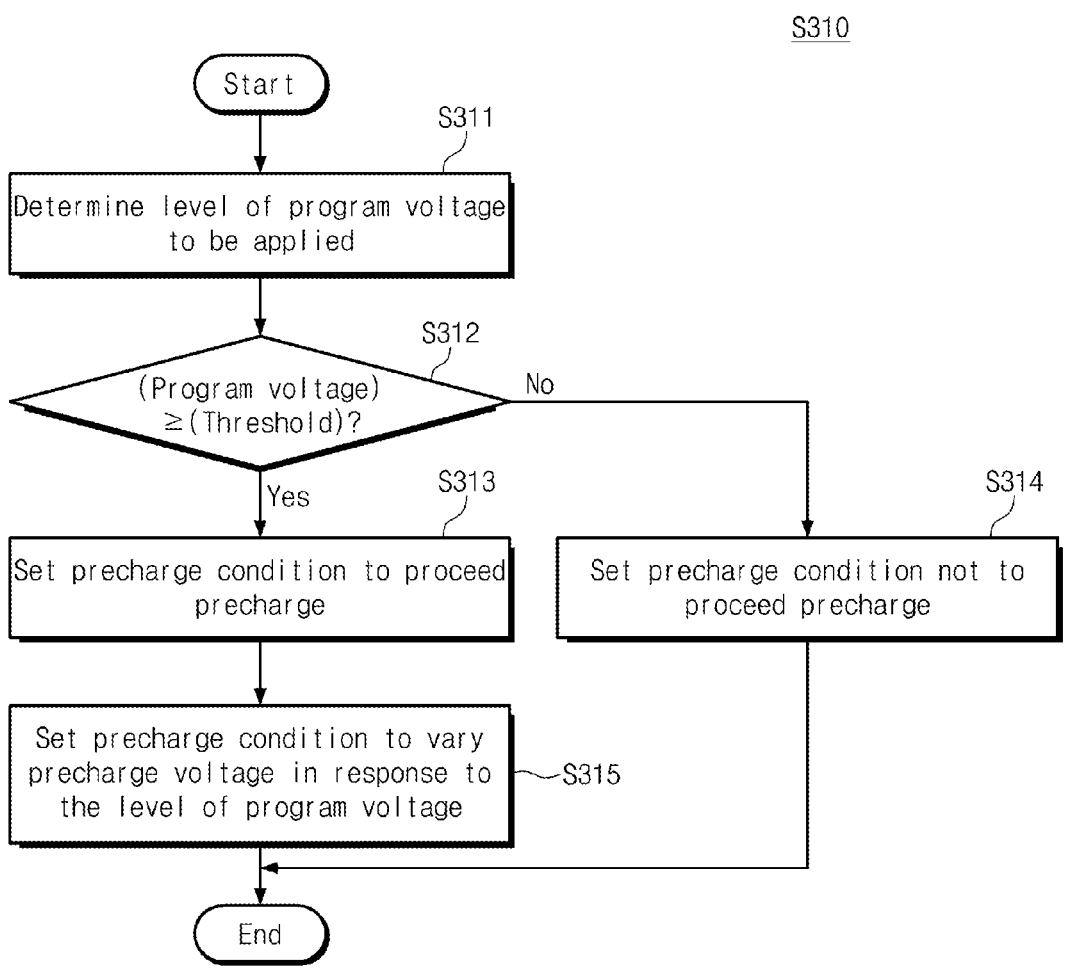
FIG. 7 is a flow chart illustrating a pre-charge condition setting operation of FIG. 3 in a program operation according to example embodiments of inventive concepts.

FIG. 7 is a flow chart illustrating a pre-charge condition setting operation of FIG. 3 in a program operation according to example embodiments of inventive concepts. According to a pre-charge condition set operation S310 of FIG. 7, a pre-charge condition may be set so that a pre-charge operation is selectively provided according to a level of a program voltage to be applied in a program operation and when the pre-charge operation is performed, a level of a pre-charge voltage varies according to the level of the program voltage.

In a operation S311, a level of a program voltage to be applied in a program operation is determined.

In a operation S312, the level of the program voltage determined in the operation S311 is compared with a desired (and/or alternatively predetermined) reference value. The reference value may be a previously designated value in a resister. The reference value may be set by a user.

If a level of the program voltage is greater than the reference value, in a operation S313, a pre-charge condition is set so that a pre-charge operation with respect to an unselected cell string is performed. If a level of the program voltage is smaller than the reference value, in a operation S314, a pre-charge condition is set so that a pre-charge operation with respect to an unselected cell string is omitted.

In a operation S315, the pre-charge condition is set so that a level of the pre-charge voltage is determined in response to the level of the program voltage determined in the operation S311.

According to the pre-charge condition set operation S310 described above, the pre-charge condition is set so that a pre-charge operation is selectively performed according to the level of the program voltage to be applied in a program operation. In addition, the pre-charge condition may be set so that the level of the pre-charge voltage varies according to the level of the program voltage when the pre-charge operation is performed. According to the pre-charge condition set operation S310, the program operation can be performed at an improved speed while limiting (and/or preventing) program disturb.

Figure 8:
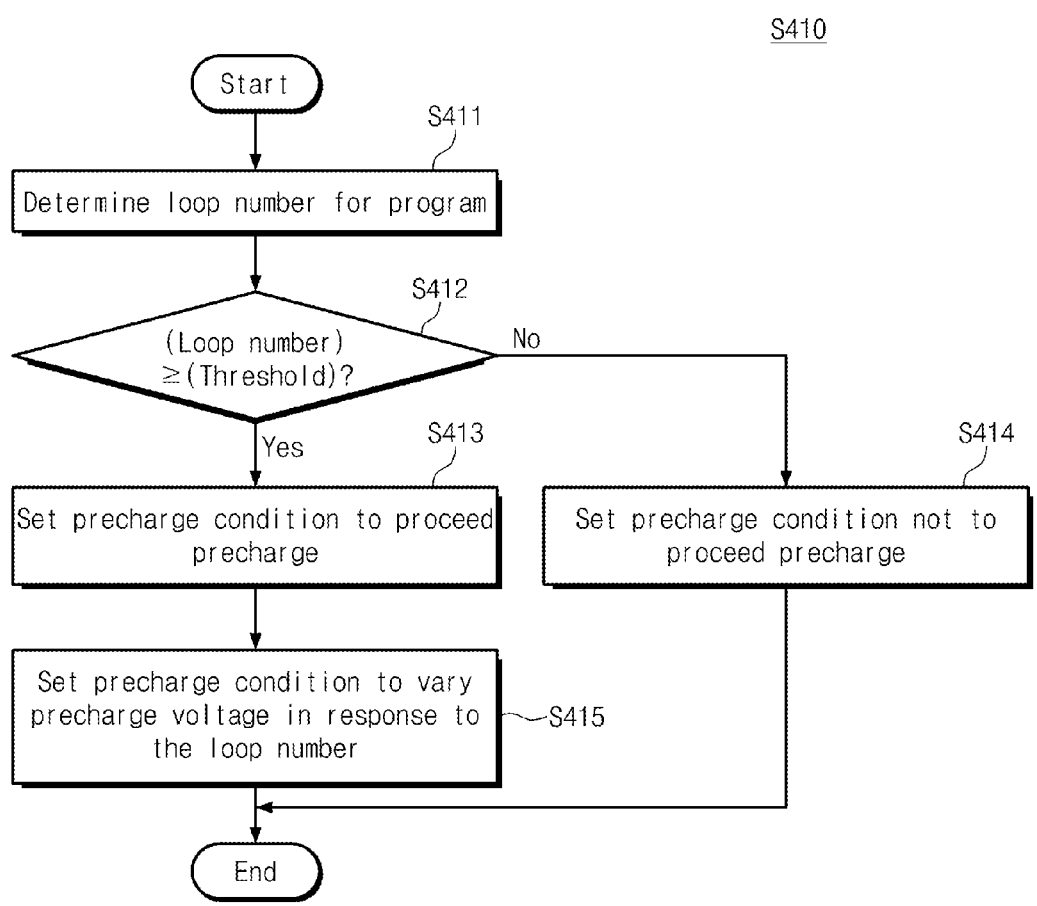
FIG. 8 is a flow chart illustrating still a pre-charge condition setting operation of FIG. 3 in a program operation according to example embodiments of inventive concepts.

FIG. 8 is a flow chart illustrating a pre-charge condition setting operation of FIG. 3 in a program operation according to example embodiments of inventive concepts. According to a pre-charge condition set operation S410 of FIG. 7, a pre-charge operation is selectively provided according to the number of program loops and a pre-charge condition can be set so that a level of a pre-charge voltage varies according to the number of program loops when the pre-charge operation is performed.

In a operation S411, the number of current loops is determined. The larger the number of current loops is, the greater a level of a program voltage being applied to a selected cell string is. That is, as the number of loops is large, the degree of program disturb with respect to an unselected cell string becomes high.

In a operation S412, the number of loops determined in the operation S411 is compared with a desired (and/or alternatively predetermined) reference value. The reference value may be a previously designated value. The reference value may be set by a user.

If the number of loops is greater than the reference value, in a operation S413, a pre-charge condition is set so that a pre-charge operation with respect to an unselected cell string is performed. If the number of loops is smaller than the reference value, in a operation S414, a pre-charge condition is set so that a pre-charge operation with respect to an unselected cell string is omitted.

In a operation S415, a pre-charge condition is set so that a level of a pre-charge voltage is determined in response to the number of loops determined in the operation S411. For example, a pre-charge condition may be set so that as the number of loops becomes greater, a level of a pre-charge voltage increases.

According to the pre-charge condition set operation S410 described above, a pre-charge condition is set so that a pre-charge operation is selectively performed according to the number of program loops. In addition, a pre-charge condition may be set so that a level of a pre-charge voltage varies according to the number of loops when a pre-charge operation is performed. According to the pre-charge condition set operation S410, a program operation can be performed at an improved speed while limiting (and/or preventing) program disturb.

Figure 9:
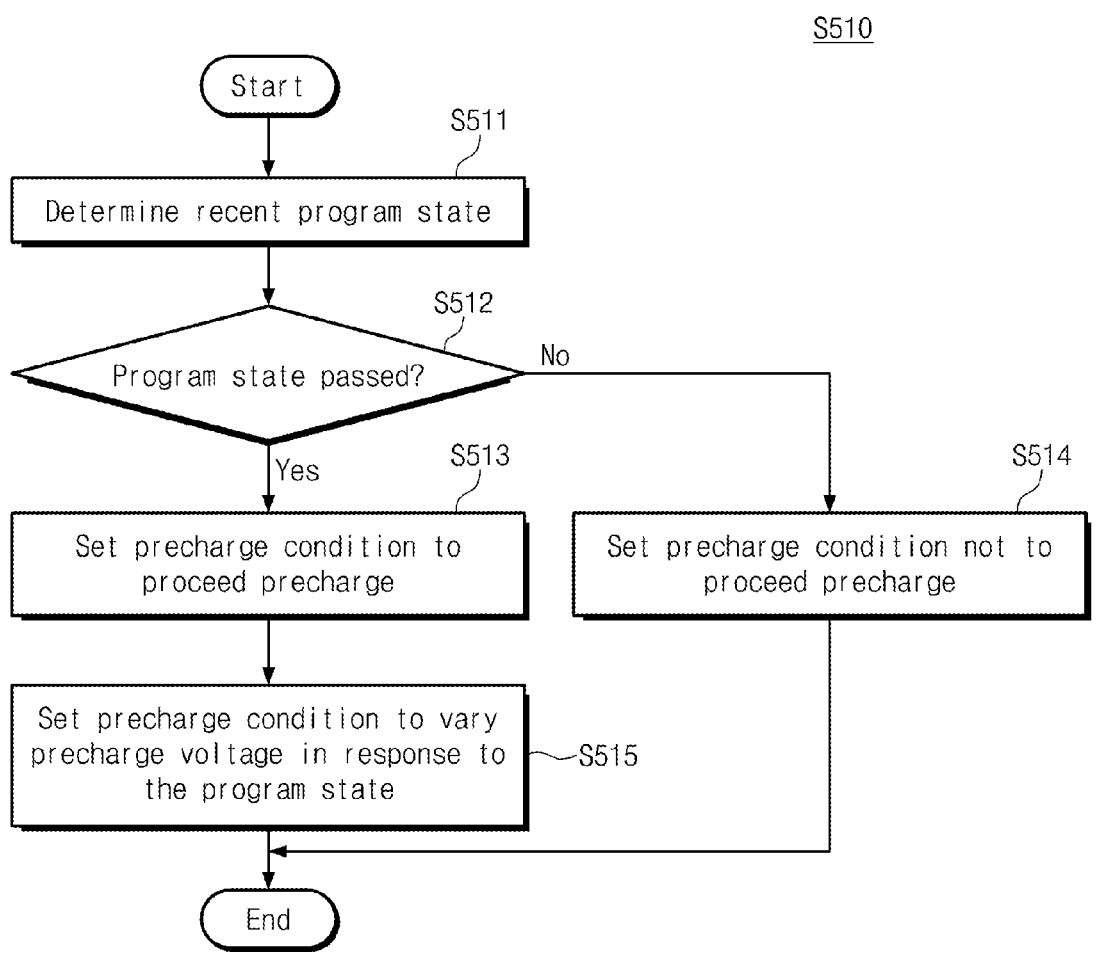
FIG. 9 is a flow chart illustrating a pre-charge condition setting operation of FIG. 3 in a program operation according to example embodiments of inventive concepts.

FIG. 9 is a flow chart illustrating a pre-charge condition setting operation of FIG. 3 in a program operation according to example embodiments of inventive concepts. According to a pre-charge condition set operation S510 of FIG. 9, a pre-charge operation is selectively provided depending on whether a desired (and/or alternatively predetermined) program state is passed or not. A pre-charge condition may also be set so that a level of a pre-charge voltage varies according to a current program state to be programmed when a pre-charge operation is performed.

In a operation S511, a recent program state is determined. The higher a threshold voltage indicating a programmed program state is, the higher a level of a program voltage being applied to a selected cell string is. That is, the recent program state may become a reference that determines the degree of program disturb with reference to an unselected cell string.

In a operation S512, it is determined whether a desired (and/or alternatively predetermined) program state is passed, that is, whether a program with respect to the desired (and/or alternatively predetermined) program state is completed.

If a program with respect to the desired (and/or alternatively predetermined) program state is completed, in a operation S513, a pre-charge condition is set so that a pre-charge operation with respect to an unselected cell string is performed. If a program with respect to the desired (and/or alternatively predetermined) program state is not completed, in a operation S514, a pre-charge condition is set so that a pre-charge operation with respect to an unselected cell string is omitted.

In a operation S515, a pre-charge condition is set so that a level of a pre-charge voltage is determined in response to the program state determined in the operation S511. For example, a pre-charge condition may be set so that the higher a threshold voltage indicating a programmed program state is, the higher a level of a pre-charge voltage becomes.

According to the pre-charge condition set operation S510, a pre-charge operation is selectively provided depending on whether a desired (and/or alternatively predetermined) program state is passed or not. A pre-charge condition may also be set so that a level of a pre-charge voltage varies according to a current program state to be programmed when a pre-charge operation is performed. According to the pre-charge condition set operation S510, a program operation can be performed at an improved speed while limiting (and/or preventing) program disturb.

Figure 10:
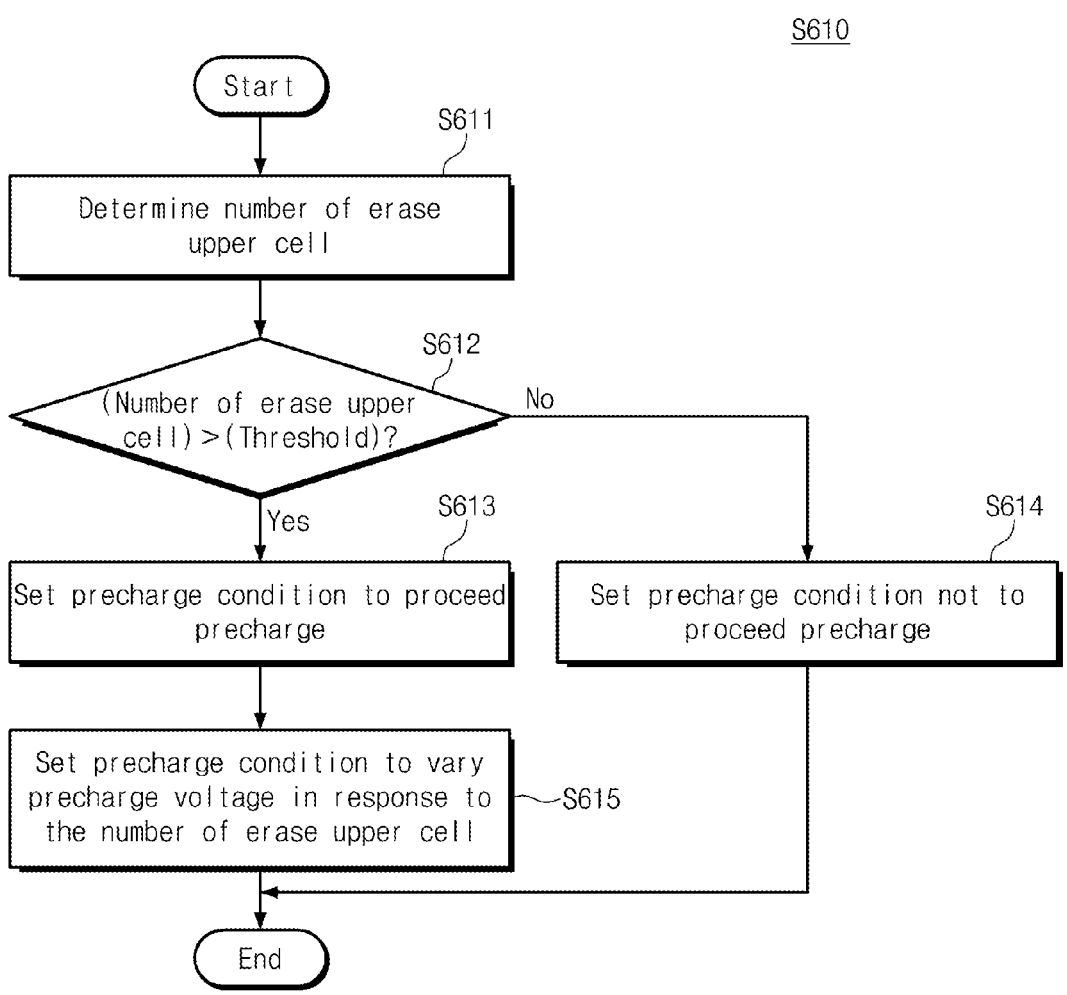
FIG. 10 is a flow chart illustrating a pre-charge condition setting operation of FIG. 3 in a program operation according to example embodiments of inventive concepts.

FIG. 10 is a flow chart illustrating a pre-charge condition setting operation of FIG. 3 according to example embodiments of inventive concepts. According to a pre-charge condition set operation S610 of FIG. 10, a pre-charge operation is selectively provided according to the number of erase upper cells. A pre-charge operation may also be set so that a level of a pre-charge voltage varies according to the number of erase upper cells when the pre-charge operation is performed.

In a operation S611, the number of erase upper cells is determined. The erase upper cell is a cell having a threshold voltage greater than a desired (and/or alternatively predetermined) voltage among erase cells. The number of erase upper cells may become a reference that determines wear volume of a cell string. Since as a cell string wears down, the degree of disturb with respect to the cell string becomes high, the number of erase upper cells may be a reference that determines a disturb environment.

In a operation S612, the number of erase upper cells determined in the operation S611 is compared with a desired (and/or alternatively predetermined) reference value.

If the number of erase upper cells is greater than the reference value, in a operation 613, a pre-charge condition is set so that a pre-charge operation with respect to an unselected cell string is performed. If the number of loops does not reach the reference value, in a operation S614, a pre-charge condition is set so that a pre-charge operation with respect to an unselected cell string is omitted.

In a operation S615, a pre-charge condition is set so that a level of a pre-charge voltage is determined in response to the number of erase upper cells determined in the operation S611. For example, a pre-charge condition may be set so that as the number of erase upper cells becomes greater, a level of a pre-charge voltage increases.

According to the pre-charge condition set operation S610 described above, a pre-charge operation is selectively provided according to the number of erase upper cells. In addition, a pre-charge condition may be set so that a level of a pre-charge voltage varies according to the number of erase upper cells when a pre-charge operation is performed. According to the pre-charge condition set operation S610, a program operation can be performed at an improved speed while limiting (and/or preventing) program disturb.

A pre-charge condition set operation was described with reference to FIGS. 5 through 10 but this is only an illustration. A pre-charge condition set operation in a program operation according to example embodiments of inventive concepts is not limited to the above-discussed examples. For example, a pre-charge condition set operation may be performed by a combination of references suggested in FIGS. 5 through 10. A pre-charge condition may be set so that a pre-charge operation is performed when a desired (and/or alternatively predetermined) program state is passed and a pre-charge voltage is determined in response to the number of current loops. A pre-charge condition may be set so that when a program voltage is greater than a desired (and/or alternatively predetermined) voltage, a pre-charge operation is performed and a pre-charge voltage is determined in response to the program voltage and the number of erase upper cells.

Figure 11:
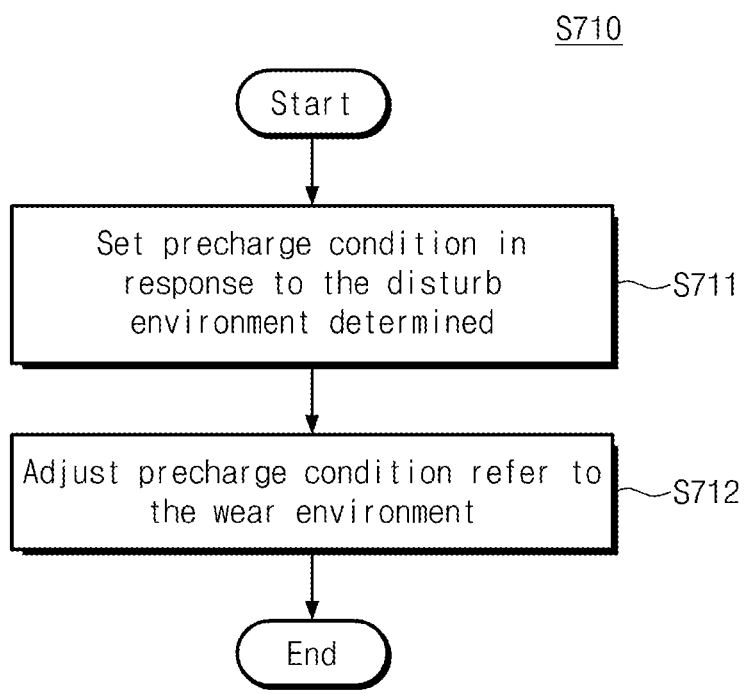
FIG. 11 is a flow chart illustrating a pre-charge condition setting operation of FIG. 3 in a program operation according to example embodiments of inventive concepts.

FIG. 11 is a flow chart illustrating a pre-charge condition setting operation of FIG. 3 in a program operation according to example embodiments. According to a pre-charge condition set operation S710 of FIG. 11, the pre-charge condition set operation S710 may further include a operation of adjusting a set pre-charge condition with reference to a wear environment.

In a operation S711, a pre-charge condition is set in response to a disturb environment. A pre-charge condition can be set in various methods including the pre-charge condition set methods described in FIGS. 5 through 10.

In a operation S712, a set pre-charge condition is adjusted with reference to a wear environment. The wear environment indicates wear volume of a cell string. The wear environment can be determined with reference to, for example, a wear level index. The wear environment can also be determined with reference to the number of program/erase cycles performed.

A section in which a pre-charge operation is performed and a pre-charge voltage being applied can be adjusted with reference to a wear environment. For example, a pre-charge condition may be adjusted so that a pre-charge operation is performed even in a disturb environment lower than a reference in the case of an environment in which wear volume is serious.

In FIG. 11, the operation S711 and the operation S712 are separately illustrated. However, this is only an illustration and the operations S711 and S712 don't necessarily have to sequentially be performed. For example, when in the operation S711, a pre-charge condition is set in response to a disturb environment, the pre-charge condition may be adjusted with reference to a wear environment to be set.

According to the pre-charge condition set operation S710 described above, a pre-charge condition can be adjusted in response to a wear environment. According to the pre-charge condition set operation S710, a program operation can be performed at an improved speed while limiting (and/or preventing) a program disturb.

Figure 12:
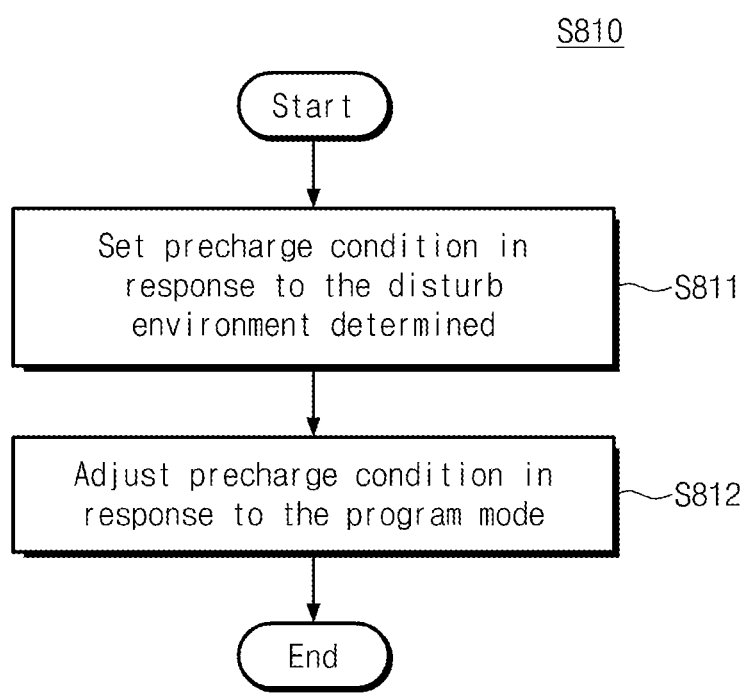
FIG. 12 is a flow chart illustrating a pre-charge condition setting operation of FIG. 3 in a program operation according to example embodiments of inventive concepts.

FIG. 12 is a flow chart illustrating a pre-charge condition setting operation of FIG. 3 in a program operation according to example embodiments of inventive concepts.

According to a pre-charge condition set operation S810 of FIG. 12, the pre-charge condition set operation S810 may further include a operation of adjusting a set pre-charge condition in response to a program mode.

In a operation S811, a pre-charge condition is set in response to a disturb environment. A pre-charge condition can be set in various methods including the pre-charge condition set methods described in FIGS. 5 through 10.

In a operation S812, a set pre-charge condition is adjusted in response to a program mode. The program mode indicates a mode storing data in memory cells. For example, the program mode may include a single level program mode using memory cells as a single-level memory cell SLC or a multi-level program mode using memory cells as a multi-level memory cell MLC.

A section in which a pre-charge operation is performed and a pre-charge voltage being applied can be adjusted with reference to the program mode. For example, since a multi-level memory cell is sensitive to disturb as compared with a single level memory cell, a pre-charge condition may be adjusted so that a pre-charge operation is performed even in a disturb environment lower than a reference in the case of a multi-level program mode.

In FIG. 12, the operation S811 and the operation S812 are separately illustrated. However, this is only an illustration and the operations S811 and S812 don't necessarily have to sequentially be performed. For example, when in the operation S811, a pre-charge condition is set in response to a disturb environment, the pre-charge condition may be adjusted with reference to a program mode to be set.

According to the pre-charge condition set operation S810 described above, a pre-charge condition can be adjusted in response to a program mode. According to the pre-charge condition set operation S810, a program operation can be performed at an improved speed while limiting (and/or preventing) a program disturb.

Figure 13:
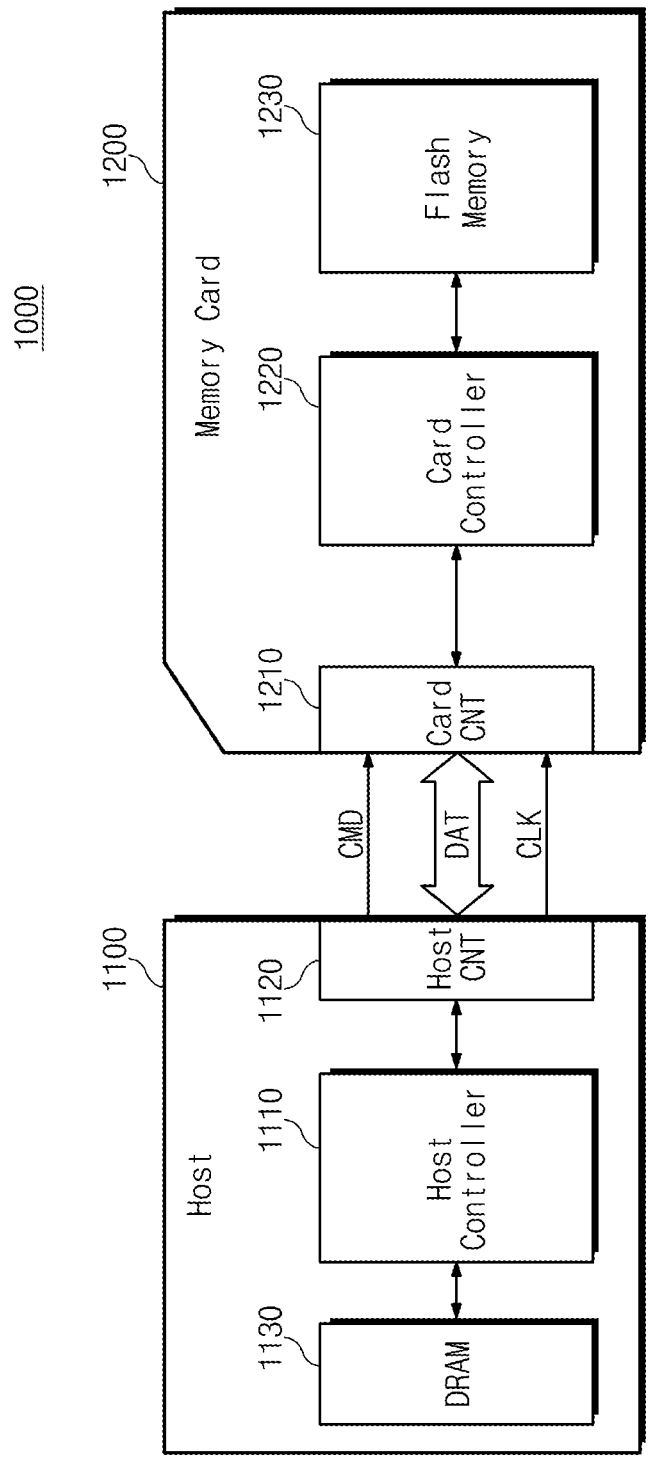
FIG. 13 is a block diagram illustrating a memory card system including a nonvolatile memory device according to example embodiments of inventive concepts.

FIG. 13 is a block diagram illustrating a memory card system including a nonvolatile memory device according to example embodiments of inventive concepts. A memory card system 1000 includes a host 1100 and a memory card 1200. The host 1100 includes a host controller 1110, a host connection unit 1120 and a DRAM 1130.

The host 1100 writes data in the memory card 1200 or reads data stored in the memory card 1200. The host controller 1110 transmits a command (e.g., a write command), a clock signal CLK generated from a clock generator (not shown) in the host 1100 and data DATA to the memory card 1200 through the host connection unit 1120. The DRAM 1130 is a main memory of the host 1100.

The memory card 1200 includes a card connection unit 1210, a card controller 1220 and a flash memory 1230. The card controller 1220 stores data in the flash memory 1230 in synchronization with a clock signal generated from a clock generator (not shown) in the card controller 1220 in response to a command received through the card connection unit 1210. The flash memory 1230 stores data transmitted from the host 1100. For example, in the case that the host 1100 is a digital camera, the flash memory 1230 stores image data.

The memory card system 1000 can pre-charge a program inhibit unselected cell string to compensate program disturb with respect to program inhibit memory cells of the flash memory 1230. The memory card system 1000 performs a pre-charge operation with respect to an unselected cell string adaptively to a disturb environment to perform a program operation at an improved speed while limiting (and/or preventing) program disturb.

Figure 14:
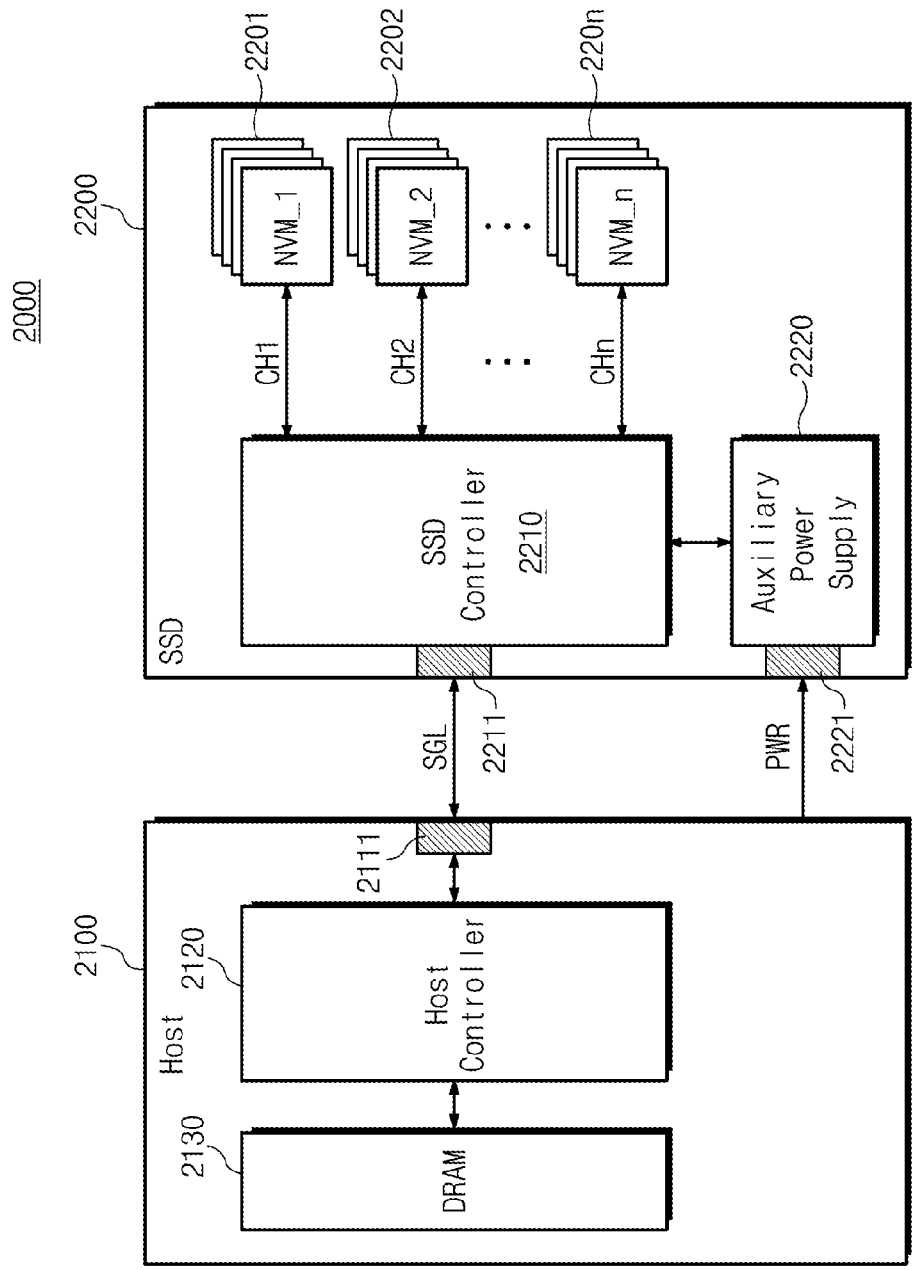
FIG. 14 is a block diagram illustrating a solid state drive (SSD) including a nonvolatile memory device according to example embodiments of inventive concepts.

FIG. 14 is a block diagram illustrating a solid state drive (SSD) including a nonvolatile memory device according to example embodiments of inventive concepts. Referring to FIG. 14, a SSD system 2000 includes a host 2100 and a SSD 2200. The host 2100 includes a host interface 2111, a host controller 2120 and a DRAM 2130.

The host 2100 writes data in the SSD 2200 or reads data stored in the SSD 2200. The host controller 2120 transmits a signal SGL such as a command, an address, a control signal, etc. to the SSD 2200 through the host interface 2111. The DRAM 2130 is a main memory of the host 2100.

The SSD 2200 exchanges a signal SGL with the host 2100 through the host interface 2211 and receives power through a power connector 2221. The SSD 2200 may include a plurality of nonvolatile memories 2201~220n, a SSD controller 2210 and an auxiliary power supply 2220. The nonvolatile memories 2201~220n can be embodied by a PRAM, a MRAM, an ReRAM, a FRAM, etc. besides a NAND flash memory. The nonvolatile memory device according to example embodiments, as described in FIG. 1, may be used as one of the nonvolatile memories 2201~220n.

The nonvolatile memories 2201~220n are used as a storage medium of the SSD 2200. The nonvolatile memories 2201~220n can be connected to a SSD controller 2210 through a plurality of channels CH1~CHn. One or more nonvolatile memories can be connected to one channel. Nonvolatile memories connected to one channel can be connected to a same data bus.

The SSD controller 2210 exchanges a signal SGL with the host 2100 through the host interface 2211. The signal SGL may include a command, an address, data, etc. The SSD controller 2210 writes data in a corresponding nonvolatile memory device or reads data from a corresponding nonvolatile memory device according to a command of the host 2100.

The auxiliary power supply 2220 is connected to the host 2100 through the power connector 2221. The auxiliary power supply 2220 receives power from the host 2100 to perform a charge operation. The auxiliary power supply 2220 may be located inside the SSD 2200 or outside the SSD 2200. For example, the auxiliary power supply 2220 can be located on a main board to provide an auxiliary power to the SSD 2200.

Figure 15:
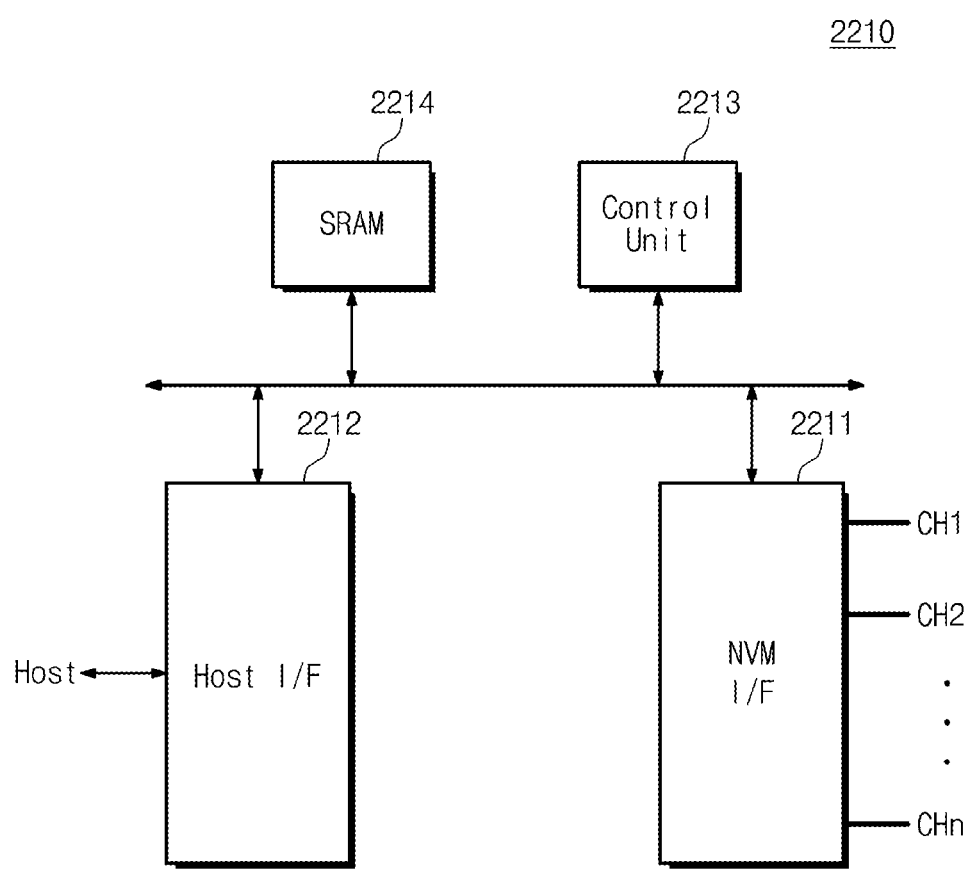
FIG. 15 is a block diagram of a SSD controller illustrated in FIG. 14.

FIG. 15 is a block diagram illustrating a constitution of a SSD controller illustrated in FIG. 14. Referring to FIG. 15, the SSD controller includes an NVM interface 2211, a host interface 2212, a control unit 2213 and a SRAM 2214.

The NVM interface 2211 scatters data transmitted from a main memory of the host 2100 on respective channels CH1~CHn. The NVM interface 2211 transmits data read from the nonvolatile memories 2201~220n to the host 2100 through the host interface 2212.

The host interface 2212 corresponds to a protocol of the host 2100 to provide an interface with the SSD 2200. The host interface 2212 can communicate with the host 2100 using a universal serial bus (USB), a small computer system interface (SCSI), a PCI express, an ATA, a parallel ATA (PATA), a serial ATA (SATA), a serial attached SCSI (SAS), etc. The host interface 2212 can perform a disk emulation function of supporting so that the host 2100 recognizes the SSD 2200 as a hard disk drive (HDD).

The control unit 2213 analyzes a signal SGL received from the host 2100 to process it. The control unit 2213 controls the host 2100 or the nonvolatile memories 2201~220n through the host interface 2212 or the NVM interface 2211. The control unit 2213 controls an operation of the nonvolatile memories 2201~220n according to a firmware for driving the SSD 2200.

The SRAM 2214 can be used to drive software (S/W) being used for an efficient management of the nonvolatile memories 2201~220n. The SRAM 2214 can store meta data received from a main memory of the host 2100 or stores cache data. In a sudden power off operation, meta data or cache data stored in the SRAM 2214 can be stored in the nonvolatile memories 2201~220n using the auxiliary power supply 2220.

Further referring to FIG. 14, the SSD system 2000 can pre-charge a program inhibit unselected cell string to compensate program disturb with respect to program inhibit memory cells of the nonvolatile memories 2201~220n. The SSD system 2000 performs a pre-charge operation with respect to an unselected cell string adaptively to a disturb environment to perform a program operation at an improved speed while limiting (and/or preventing) program disturb.

In FIGS. 14 and 15, the SRAM 2214 can be replaced with a nonvolatile memory. The SSD system in accordance with example embodiments of inventive concepts can be embodied so that a nonvolatile memory device such as a flash memory, a PRAM, an RRAM, a MRAM, etc. performs a function of the SRAM 2214.

Figure 16:
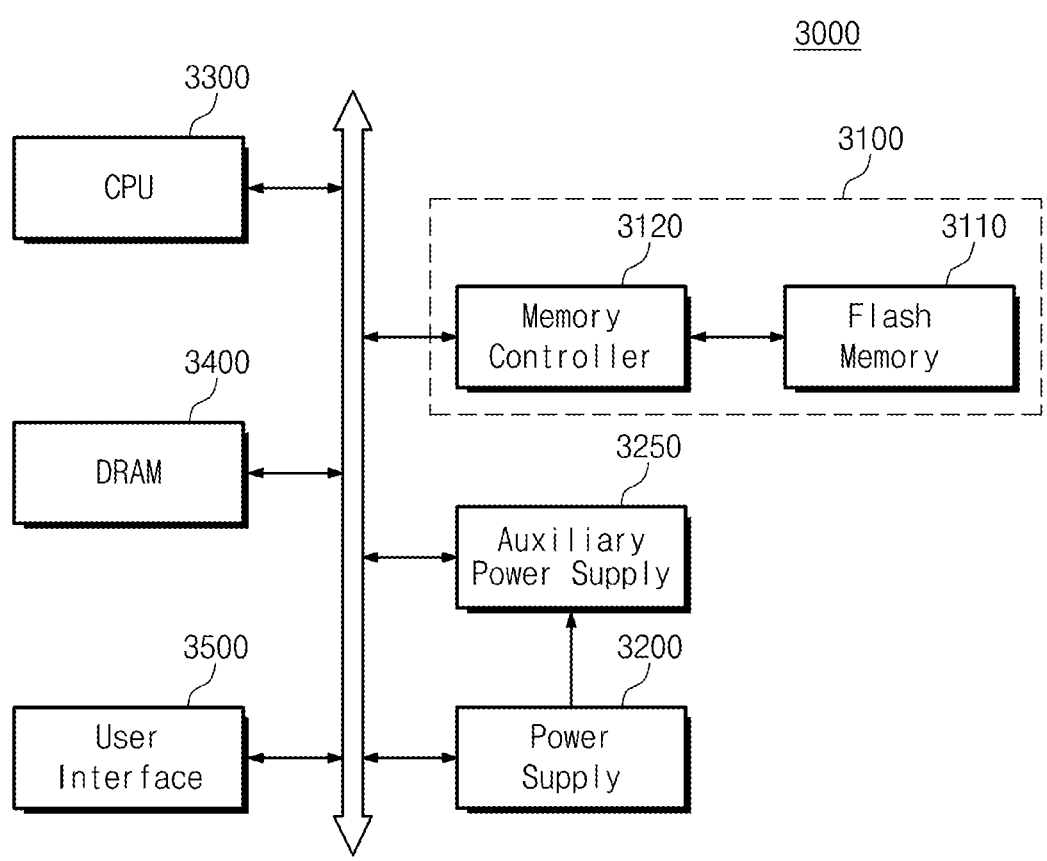
FIG. 16 is a block diagram illustrating an electronic device including a nonvolatile memory device according to example embodiments of inventive concepts.

FIG. 16 is a block diagram illustrating an electronic device including a nonvolatile memory device according to example embodiments of inventive concepts. The electronic device 3000 may be embodied by a personal computer PC or may be embodied by a portable electronic device such as a notebook computer, a cellular phone, a personal digital assistant (PDA), and a camera.

Referring to FIG. 16, the electronic device 3000 includes a memory device 3100, a power supply 3200, an auxiliary power supply 3250, a central processing unit 3300, a DRAM 3400, and a user interface 3500. The memory device 3100 includes a flash memory 3110 and a memory controller 3120. The memory device 3100 can be built in the electronic device 3000. The nonvolatile memory device according to example embodiments, as described in FIG. 1, may be used as flash memory 3110.

As described above, the electronic device 3000 can pre-charge a program inhibit unselected cell string to compensate program disturbance with program inhibit memory cells of the flash memory 3110. The electronic device 3000 performs a pre-charge operation with respect to an unselected cell string adaptively to a disturb environment to perform a program operation at an improved speed while limiting (and/or preventing) program disturb.

It should be understood that example embodiments described herein should be considered in a descriptive sense only and not for purposes of limitation. While some example embodiments have been particularly shown and described, it will be understood by one of ordinary skill in the art that variations in form and detail may be made therein without departing from the spirit and scope of the claims.

What is claimed is:

1. A nonvolatile memory device comprising:
    a memory cell array comprising a plurality of cell strings that include a selected cell string and an unselected cell string that are connected to a first bit-line in common, each of the plurality of cell strings including a string selection transistor (SST) and a plurality of serially-connected nonvolatile memory cells that are stacked on or above a substrate in a direction that is perpendicular to the substrate, the SST of the selected cell string being connected to a selected string selection line (SSL), the SST of the unselected cell string being connected to an unselected SSL, a first memory cell among the plurality of serially-connected nonvolatile memory cells of the selected cell string and a second memory cell among the plurality of serially-connected nonvolatile memory cells of the unselected cell string being connected to a first word-line in common;
    an address decoder configured to apply a program voltage to the first word-line, and configured to apply a selected SSL voltage to the selected SSL and an unselected SSL voltage to the unselected SSL;

a control circuit configured to control a plurality of program loops to program the first memory cell, the plurality of program loops including a corresponding program loop, the control circuit being configured to determine whether to perform a pre-charge operation for each of the plurality of program loops based on a loop number of the corresponding program loop or a level of the program voltage corresponding to the corresponding program loop, the level of the program voltage corresponding to the corresponding program loop becoming higher as the loop number of the corresponding program loop becomes greater, and the pre-charge operation for the corresponding program loop is determined to be formed when the loop number of the corresponding program loop is greater than a reference value; and a read and write circuit configured to apply a pre-charge voltage, wherein if the control circuit determines to perform the pre-charge operation for a first program loop among the plurality of program loops, the address decoder applies the unselected SSL voltage to turn-on the SST of the unselected cell string to the unselected SSL during the first program loop, while the read and write circuit applies the pre-charge voltage to the first bit-line before the address decoder applies the program voltage corresponding to the first program loop to the first word-line during the first program loop, the read and write circuit is further configured to apply a program bit-line voltage to the first bit-line while the address decoder applies the program voltage corresponding to the first program loop to the first word-line during the first program loop, and if the control circuit determines not to perform the pre-charge operation for a second program loop among the plurality of program loops, the unselected SSL voltage to turn-on the SST of the unselected cell string is not applied to the unselected SSL until the program voltage corresponding to the second program loop is applied to the first word-line during the second program loop, wherein the control circuit is further configured to compare the loop number of the corresponding program loop with the reference value to determine whether to perform the pre-charge operation.

2. The nonvolatile memory device of claim 1, wherein the pre-charge voltage has a positive level.

3. The nonvolatile memory device of claim 1, wherein the control circuit is configured to adjust a condition of the pre-charge operation based on a wear environment of the nonvolatile memory device.

4. The nonvolatile memory device of claim 3, wherein the control circuit adjusts the condition of the pre-charge operation by adjusting a level of the pre-charge voltage or by adjusting a time period of applying the pre-charge voltage to the first bit-line.

5. The nonvolatile memory device of claim 1, wherein when the loop number of the corresponding program loop is greater than the reference value, the pre-charging voltage corresponding to the corresponding program loop increases as the loop number of the corresponding program loop becomes greater.

6. The nonvolatile memory device of claim 1, wherein when the loop number of the corresponding program loop is greater than the reference value, a time period of applying the pre-charge voltage to first bit-line during the corresponding program loop increases as the loop number of the corresponding program loop becomes greater.

7. The nonvolatile memory device of claim 1, wherein each of the plurality of cell strings includes a ground selection transistor (GST), and a ground select line is connected to the GST of each of the selected cell string and the unselected cell string in common.

8. A nonvolatile memory device which includes a plurality of memory cell strings and each of the memory cell strings including a plurality of memory cells stacked in a direction perpendicular to a substrate, the nonvolatile memory device comprising:

a first memory cell string coupled to a selected bit line and a selected string selection line;

a second memory cell string coupled to the selected bit line and an unselected string selection line; and a third memory cell string coupled to an unselected bit line, wherein pre-charge conditions are determined based on a disturb environment between the first memory cell string and the second memory cell string, wherein a first program loop is performed when a first pre-charge condition is determined, and during a first bit line setup section of the first program loop, a bit line program voltage is applied to the selected bit line and a program inhibition voltage is applied to the unselected bit line, wherein a second program loop is performed when a second pre-charge condition is determined, during a first bit line setup section of the second program loop, a bit line pre-charge voltage is applied to the selected bit line and the program inhibition voltage is applied to the unselected bit line.

9. The nonvolatile memory device of claim 8, wherein a level of the program inhibition voltage is higher than a level of the bit line program voltage or a power supply voltage, wherein a level of the bit line pre-charge voltage is higher than the bit line program voltage.

10. The nonvolatile memory device of claim 8, wherein during the first bit line setup section of the first program loop or the second program loop, a turn-on voltage is applied to both the selected string selection line and the unselected string selection line.

11. The nonvolatile memory device of claim 10, wherein the turn-on voltage is sufficient to turn on a string selection transistor coupled to the selected string selection line or the unselected string selection line.

12. The nonvolatile memory device of claim 10, wherein the turn-on voltage is a power supply voltage, and the bit line program voltage is a ground voltage.

13. The nonvolatile memory device of claim 12, further comprising:

a word line coupled to selected memory cells, wherein during a second bit line setup section of the first program loop following the first bit line setup section of the first program loop, the turn-on voltage provided to the unselected string selection line is changed to a turn-off voltage before a program voltage is applied to the word line, wherein during a second bit line setup section of the second program loop following the first bit line setup section of the second program loop, the turn-on voltage provided to the unselected string selection line is changed to the turn-off voltage before the program voltage is applied to the word line.

14. The nonvolatile memory device of claim 8, wherein a program voltage of the first program loop applied to selected memory cells is lower than a reference voltage in the first pre-charge condition, and a program voltage of the second program loop applied to the selected memory cells is equal to or higher than the reference voltage in the second pre-charge condition.

15. The nonvolatile memory device of claim 8, wherein a number of program loops of the first program loop is smaller than a reference value in the first pre-charge condition, and a number of program loops of the second program loop is equal to or greater than the reference value in the second pre-charge condition.

16. The nonvolatile memory device of claim 8, wherein a program state of the first program loop indicates a program fail in the first pre-charge condition, and a program state of the second program loop indicates a program pass in the second pre-charge condition.

17. The nonvolatile memory device of claim 8, wherein a number of program/erase cycles of the first program loop is smaller than a reference value in the first pre-charge condition, and a number of program/erase cycles of the second program loop is equal to or greater than the reference value in the second pre-charge condition.

18. The nonvolatile memory device of claim 8, wherein the pre-charge conditions are determined based on a wear level index or a number of memory cells in the first cell string and the second cell string having a threshold voltage higher than a reference threshold voltage.

19. A nonvolatile memory device which includes memory cells stacked in a direction perpendicular to a substrate, the nonvolatile memory device comprising:
   a first memory cell string coupled to a selected bit line and a selected string selection line, which extends in a vertical direction to the substrate;
   a second memory cell string coupled to the selected bit line and an unselected string selection line, which extends in a vertical direction to the substrate; and
   a third memory cell string coupled to an unselected bit line, which extends in a vertical direction to the substrate,
   wherein pre-charge conditions are determined based on a disturb environment between the first memory cell string and the second memory cell string,
   wherein a first program operation is performed when a first pre-charge condition is determined, and during a first bit line setup section of the first program operation, a bit line program voltage is applied to the selected bit line and a program inhibition voltage is applied to the unselected bit line,
   wherein a second program operation is performed when a second pre-charge condition is determined, during a first bit line setup section of the second program operation, the program inhibition voltage is applied to both the selected and unselected bit lines,
   wherein during the first bit line setup section of the first or second program operations, a voltage sufficient to turn on a string selection transistor connected to the selected or unselected string selection line is applied to both the selected string selection line and the unselected string selection line and the string selection transistor is configured to select the selected or unselected bit lines.

20. The nonvolatile memory device of claim 19, after the first bit line setup section of the second program operation, the program inhibition voltage applied to the selected bit line is changed to the bit line program voltage.

* * * * *